(12) United States Patent
Yang et al.

(10) Patent No.: US 9,735,232 B2
(45) Date of Patent: Aug. 15, 2017

(54) METHOD FOR MANUFACTURING A SEMICONDUCTOR STRUCTURE HAVING A TRENCH WITH HIGH ASPECT RATIO

(71) Applicant: TAIWAN SEMICONDUCTOR MANUFACTURING COMPANY LTD., Hsinchu (TW)

(72) Inventors: Tai-I Yang, Hsinchu (TW); Jheng-Sheng You, Hsinchu County (TW); Chi-Fu Lin, Hsinchu County (TW); Tien-Lu Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/339,974

(22) Filed: Jul. 24, 2014

(65) Prior Publication Data
US 2015/0079771 A1   Mar. 19, 2015

Related U.S. Application Data

(63) Continuation-in-part of application No. 14/030,156, filed on Sep. 18, 2013.

(51) Int. Cl.
*H01L 29/06* (2006.01)
*H01L 29/78* (2006.01)

(52) U.S. Cl.
CPC ...... *H01L 29/0661* (2013.01); *H01L 29/0634* (2013.01); *H01L 29/78* (2013.01)

(58) Field of Classification Search
CPC .. H01L 29/0661; H01L 29/0634; H01L 29/78

USPC .............. 257/607; 438/407, 520, 548, 918
See application file for complete search history.

(56) References Cited

U.S. PATENT DOCUMENTS

| | | | |
|---|---|---|---|
| 7,811,907 B2 | 10/2010 | Shibata et al. | |
| 8,835,264 B1* | 9/2014 | Lin | H01L 21/76224 438/296 |
| 2001/0026980 A1* | 10/2001 | Mizuo | H01L 21/3065 438/296 |
| 2001/0041400 A1 | 11/2001 | Ren et al. | |
| 2005/0106847 A1* | 5/2005 | Hiruta | H01L 21/28167 438/585 |
| 2007/0190341 A1* | 8/2007 | Furuya | C25D 3/38 428/446 |
| 2009/0032865 A1* | 2/2009 | Hirler | H01L 29/407 257/328 |

(Continued)

OTHER PUBLICATIONS

Tai-I Yang, U.S. Appl. No. 14/030,156 (not yet published), filed Sep. 18, 2013.

*Primary Examiner* — John C Ingham
*Assistant Examiner* — Didarul Mazumder
(74) *Attorney, Agent, or Firm* — WPAT, P.C., Intellectual Property Attorneys

(57) ABSTRACT

The present disclosure provides a method for manufacturing a semiconductor structure. The method includes several operations as follows. A semiconductor substrate is received. A trench along a depth in the semiconductor substrate is formed. The semiconductor substrate is exposed in a hydrogen containing atmosphere. Dopants are inserted into a portion of the semiconductor substrate. A dielectric is filled in the trench. The dopants are driven into a predetermined distance in the semiconductor substrate.

15 Claims, 21 Drawing Sheets

(56) References Cited

U.S. PATENT DOCUMENTS

| | | | |
|---|---|---|---|
| 2009/0159969 A1* | 6/2009 | Lorenti | H01L 21/02057 257/337 |
| 2010/0219463 A1* | 9/2010 | Cheng | H01L 29/0653 257/329 |
| 2012/0018800 A1* | 1/2012 | Kim | H01L 29/0634 257/330 |
| 2012/0286352 A1 | 11/2012 | Kuo | |
| 2014/0264559 A1* | 9/2014 | Yang | H01L 29/7802 257/329 |

* cited by examiner

METHOD FOR MANUFACTURING A SEMICONDUCTOR STRUCTURE HAVING A TRENCH WITH HIGH ASPECT RATIO

BACKGROUND

Semiconductor devices are widely adopted in various applications. As a result, user demands for higher performance and functionality have steadily increased. For example, a compressor with frequency conversion is expected to be capable of reducing on-resistance, performing high speed switching and maintaining high breakdown voltage. In order to fulfill the requirements, the compressor needs to be equipped with several structures such as super junctions.

The super junction structure is constructed by alternately arranging an n-type impurity area and a p-type impurity area constituting a p-n column pair. Usually, several processes, such as multiple etching, implanting and driving-in, are involved in constructing the p-n column pair. However, the implanted area is etched in a way that shapes the impurity region into a jagged contour which is unable to perform the function of the super junction. Thus, a structure or a method for forming the p-n column pair is still in great demand.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION

Figure 1:
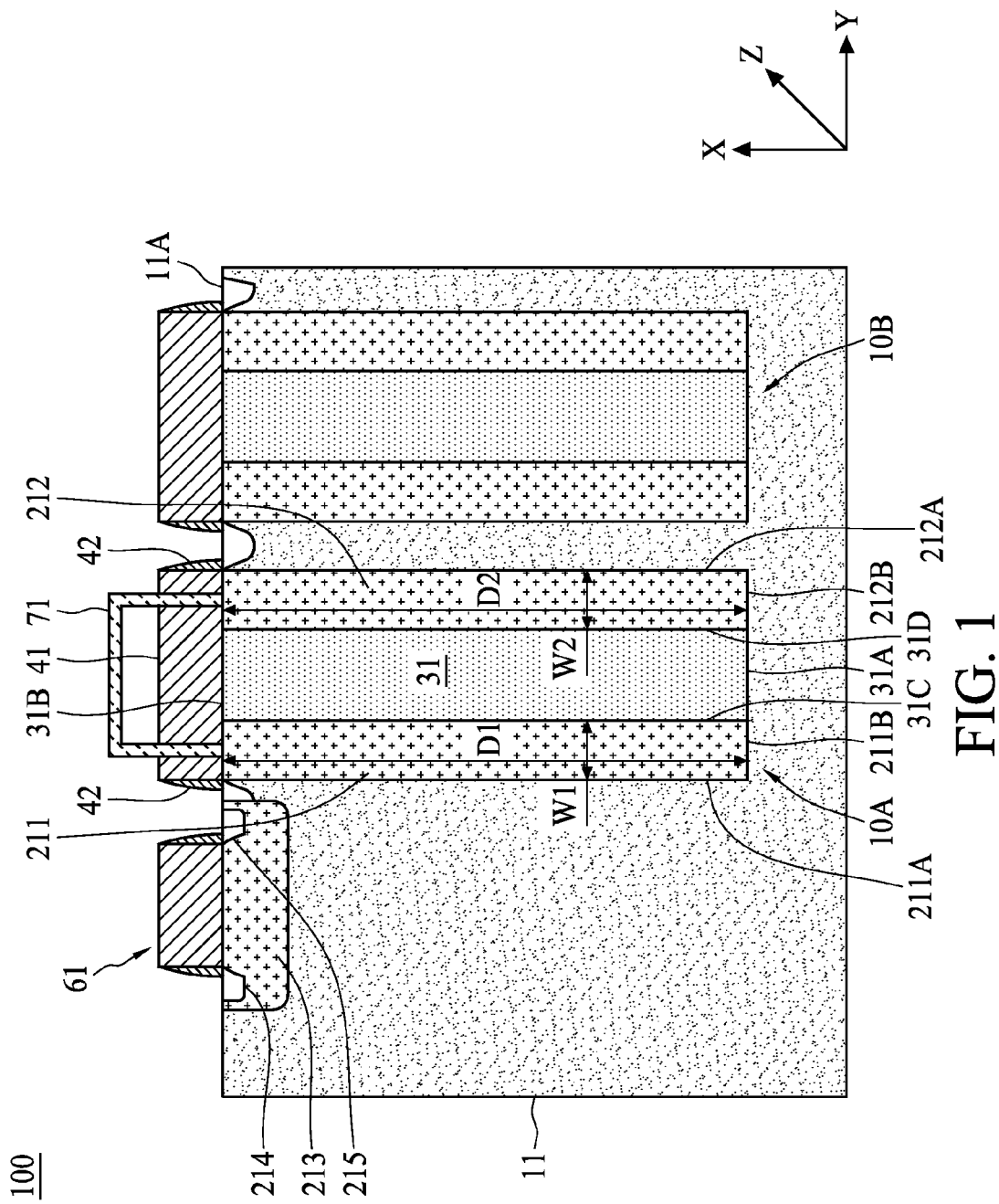
FIG. 1 is a cross-sectional view of two EFD structures in a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the present disclosure, since a single deep etching operation is substituted for the multiple etching operations and the multiple implanting operations are replaced by a pre-depositing operation, the dopant distribution in the impurity area is shaped like a strip. Thus, the electric field distribution between a semiconductor substrate and the strip is uniform and hence, enhances the breakdown voltage of the semiconductor structure.

In various embodiments, an electric field distribution (EFD) structure is provided. The EFD structure includes, but is not limited to, a string, a set of multiple strips, a set of multiple columns, a loop with a compound that fills the vacancy surrounded by the loop, and a set of multiple posts. The EFD structure is configured to distribute the electric field at a specific junction such as a p-n junction. Since the dopant in the EFD structure is prone to be diffused along a direction perpendicular to a depth of the semiconductor substrate, the doped location and the uniformity of the EFD structure is predicted or controlled.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits. In some embodiments, the bulk substrate includes a wafer such as a polished wafer, an epi wafer, an argon anneal wafer, a hai wafer and a silicon on insulator (SOI) wafer.

As used herein, "deposition" refers to operations of depositing materials on a substrate using a vapor phase of a material to be deposited, a precursor of the material, an electrochemical reaction, or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

As used herein, "metal oxide" refers to binary metal oxides, transition metal oxides, and lanthanide series metal oxides. The metal oxides described herein are often nonstoichiometric, thus a subscript "x" for the oxygen composition is used in the present disclosure. The metal oxide includes MgOx, AlOx, TiOx, CrOx, MnOx, FeOx, CoOx, NiOx, CuOx, ZnOx, GeOx, YOx, ZrOx, NbOx, MoOx, SnOx, LaOx, HfOx, TaOx, WOx, CeOx, GdOx, YbOx, and LuOx.

As used herein, a "mask layer" recited in the present disclosure is an object of a patterning operation. The patterning operation includes various steps and operations and varies in accordance with features of embodiments. In some embodiments, a patterning operation patterns an existing film or layer. The patterning operation includes forming a mask on the existing film or layer and removing the unmasked portion of the film or layer with an etch or other removal operations. The mask layer is a photo resist or a hardmask. In some embodiments, a patterning operation directly forms a patterned layer on a surface. The patterning operation includes forming a photosensitive film on the surface, conducting a photolithography operation and a developing operation. The remaining photosensitive film may be removed or retained and integrated into the package.

As used herein, an "electric-field distribution (EFD)" structure recited in the present disclosure refers to a capacitor-like structure with two low resistance layers sandwiching a high resistance layer. In some embodiments, the low resistance layers are non-metal such as polysilicon or doped silicon having a resistance lower than the resistance of the layer being sandwiched. In some embodiments, the high resistance layer is dielectric materials including foresaid metal oxides. In certain embodiments, the EFD structure is not limited to a vertical stack and hence, a planar stack is used for a special configuration. At least two doped semiconductor-insulator interfaces are created in an EFD structure. In certain embodiments of the present disclosure, the contour of the interface includes at least one of a straight line, an arc, a tilt, or the like.

As used herein, a "spacer" recited in the present disclosure refers to structures surrounding a protrusion positioned on a surface and contacting the sidewall of said protrusion. The spacer is used to seclude the protrusion from the adjacent elements on the surface. In some embodiments, the protrusion is subsequently removed, leaving only the spacer on the surface. The spacer recited in the present disclosure is composed of insulating materials such as oxides, polymer, ceramics, or conductive materials such as Pt, AlCu, TiN, Au, Ti, Ta, TaN, W, WN, Cu, and the combinations thereof. Some embodiments of the present disclosure provide a method for controlling a semiconductor deposition operation. The method includes (i) identifying a first target lifetime in a physical vapor deposition (PVD) system; (ii) inputting the first target lifetime into a processor; (iii) outputting, by the processor, a plurality of first operation parameters according to a plurality of compensation curves; and (iv) performing the first operation parameters in the PVD system.

Referring to FIG. 1, a cross-sectional view of two EFD structures 10A and 10B in a semiconductor structure 100, which is adopted in various applications, such as a compressor, is depicted. In some embodiments, the EFD structure 10A is identical to the EFD structure 10B, and hence the following description is directed to the EFD structure 10A. A dielectric 31 is disposed in the semiconductor substrate 11 and along the X axis. First and second doped regions 211, 212 are disposed in the semiconductor substrate 11 with a depth along the Y axis. A third doped region 213 is a well region in the semiconductor substrate 11. In addition, a cover 41 is on the semiconductor substrate 11. Two spacers 42 are attached to the cover 41. An active component 61, such as a metal oxide semiconductor (MOS), is on the semiconductor substrate 11 and configured as a transistor.

In some embodiments, the semiconductor substrate 11 encompasses most of elements in the semiconductor structure 100. The semiconductor substrate 11 surrounds a side wall 211A and a bottom surface 211B of the first doped region 211. Since the first doped region 211 and the second doped region 212 are symmetrical with reference to the dielectric 31, the semiconductor substrate 11 also surrounds a side wall 212A and a bottom surface 212B of the second doped region 212. In addition, the semiconductor substrate 11 is under a bottom surface 31A of the dielectric 31. The third doped region 213 is spaced from the first doped region 211 with a predetermined distance. In some embodiments, the distance is between about 1 μm and about 10 μm. In certain embodiments, the distance is between about 0.5 μm and about 7.8 μm. In other embodiments, the distance is between about 1.7 μm and about 6.9 μm. In some other embodiments, the distance is between about 3.3 μm and about 4.6 μm. The foresaid distance is designed according to location of the EFD structure 10A.

The electric conductivity type of the semiconductor substrate 11 is opposite to the electric conductivity types of the first doped region 211, the second doped region 212 and the third doped region 213. In some embodiments, the electric conductivity type of the semiconductor substrate 11 is n-type, while the first doped region 211, the second doped region 212 and the third doped region 213 are p conductivity type semiconductors.

The shape of the first doped region 211 is in various types. In some embodiments, the first doped region 211 follows the contour of a portion of the dielectric 31. In some embodiments, the first doped region 211 is in a columnar, strip, or staggered shape.

The impurity or dopant of the first doped region 211 is distributed along the Y axis. Particularly, the first doped region 211 has a greater dopant concentration at a location closer to the dielectric 31 than the dopant concentration at a location closer to the semiconductor substrate 11. In some embodiments, the dopant concentration in the first doped region 211 is in a gradient with a maximum value at an interface between the first doped region 211 and the dielectric 31, and a minimum value at an interface between the first doped region 211 and the substrate 11. Along the X axis, the dopant concentration is substantially uniform. In some embodiments, the dopant concentration uniformity along the depth (or X axis) of the first doped region 211 is within 0.2%. Thus, the first doped region 211 is shaped like a strip.

In some embodiments, the first doped region 211 includes a first depth D1 and a first width W1. In some embodiments, the first depth D1 is greater than about 15 μm. In certain embodiments, the first depth D1 is between about 16 μm and 300 μm. In other embodiments, the first depth D1 is between about 23.5 μm and about 150 μm. In some other embodiments, the first depth D1 is between about 37.7 μm and about 190.6 μm. In some embodiments, since the first width W1 is between about 1 μm and about 5 μm, the aspect ratio (depth divided by width) of the first doped region 211 is between about 30:1 to about 10:1. In certain embodiments, the aspect ratio of the first doped region 211 is between about 300:1 to about 3:1. In some other embodiments, the aspect ratio of the first doped region 211 is between about 38.1:1 to about 23.5:1. In other words, the aspect ratio of the first doped region 211 in the semiconductor substrate 11 is greater than about 10.

The first doped region 211 is sandwiched between the semiconductor substrate 11 and the dielectric 31 along the Y axis. A junction between the first doped region 211 and the semiconductor substrate 11 extends along the Z axis, which is perpendicular to the X and Y axis. The electric field is evenly distributed around the junction.

In some embodiments as in FIG. 1, the first doped region 211 and the second doped region 212 are symmetrical with reference to the dielectric 31. The second doped region 212 has same depths and widths with the first doped region 211. For dopant concentration along the Y axis, the second doped region 212 has a greater dopant concentration at a location closer to the dielectric 31 than the dopant concentration at a location closer to the semiconductor substrate 11. In some embodiments, the dopant concentration in the second doped region 212 is in a gradient with a maximum value at an interface between the second doped region 212 and the dielectric 31 and a minimum value at an interface between the second doped region 212 and the semiconductor substrate 11. The dopant concentration along the X axis is substantially uniform and the dopant concentration uniformity along the depth of the second doped region 212 is within 0.2%.

In some embodiments, the material of the dielectric 31 is selected from oxide, metal oxide, nitride, phosphosilicate glass (PSG), tetra-ethyl-ortho-silicate (TEOS) oxide, Black Diamond® (Applied Materials of Santa Clara, Calif.), amorphous fluorinated carbon, low-k dielectric materials and borophosphosilicate Glass (BPSG). Examples of the oxide are selected from silicon dioxide ($SiO_2$), phosphorus pentoxide ($P_4O_{10}$), selenium dioxide ($SeO_2$), and sulfur trioxide ($SO_3$). Examples of the metal oxide are selected from zinc oxide (ZnO), aluminum oxide ($Al_2O_3$), iron(II,III) oxide ($Fe_3O_4$), calcium oxide (CaO), ruthenium tetroxide ($RuO_4$), osmium(VIII) oxide ($OsO_4$), iridium tetroxide ($IrO_4$), indium tin oxide ($In_2O_3:SnO_2$), xenon tetroxide ($XeO_4$), nickel oxide, titanium oxide, hafnium oxide, zirconium oxide, tungsten oxide, tantalum oxide, molybdenum oxide and copper oxide. Examples of the nitride are selected from silicon nitride ($Si_3N_4$), titanium nitride (TiN), silicon oxynitride ($Si_2N_2O$), thallium(I) nitride ($Tl_3N$), magnesium nitride ($Mg_3N_2$), beryllium nitride ($Be_3N_2$), calcium nitride($Ca_3N_2$) and strontium nitride ($Sr_3N_2$).

In some embodiments as in FIG. 1, the cover 41 is over the top surface 31B of the dielectric 31. In other words, the dielectric 31 is between the cover 41 and the semiconductor substrate 11 along the X axis. The cover 41 is used to protect the dielectric 31 from being etched. In some embodiments, the cover 41 is designed to extend along the Z axis along with the dielectric 31.

In some embodiments, the material of the cover 41 is designed to have a highly selective etching rate between the cover 41 and the dielectric 31. Thus, the material of the cover 41 is distinguishable from the material of the dielectric 31 and selected from the oxide, metal oxide, nitride, metal, polysilicon, and silicide. Examples of the oxide are selected from silicon dioxide ($SiO_2$), phosphorus pentoxide ($P_4O_{10}$), selenium dioxide ($SeO_2$), and sulfur trioxide ($SO_3$). Examples of the metal oxide are selected from zinc oxide (ZnO), aluminum oxide ($Al_2O_3$), iron(II,III) oxide ($Fe_3O_4$), calcium oxide (CaO), ruthenium tetroxide ($RuO_4$), osmium (VIII) oxide ($OsO_4$), iridium tetroxide ($IrO_4$), indium tin oxide ($In_2O_3:SnO_2$), xenon tetroxide ($XeO_4$), nickel oxide, titanium oxide, hafnium oxide, zirconium oxide, tungsten oxide, tantalum oxide, molybdenum oxide and copper oxide. Examples of the nitride are selected from silicon nitride (Si3N4), titanium nitride (TiN), silicon oxynitride ($Si_2N_2O$), thallium(I) nitride ($Tl_3N$), magnesium nitride ($Mg_3N_2$), beryllium nitride ($Be_3N_2$), calcium nitride($Ca_3N_2$) and strontium nitride ($Sr_3N_2$). Examples of the metal are selected from Aluminum (Al), Chromium (Cr), Gold (Au), Molybdenum (Mo), Platinum (Pt), Tantalum (Ta), Titanium (Ti), Copper (Cu) and Tungsten (W).

In some embodiments as in FIG. 1, an interconnect 71 external to the semiconductor substrate 11 is electrically connected with the first doped region 211 and the second doped region 212. Since the first doped region 211 and the second doped region 212 are electrically connected through the interconnect 71, the p-n junctions at opposite sides with reference to the dielectric 31 are able to evenly distribute the electric field. In some embodiments, the interconnect 71 is through the cover 41. An electric voltage is easily applied to the EFD structure 10A through the interconnect 71. In other embodiments, the interconnect 71 is an electric trace, which is embedded in the cover 41.

In some embodiments, spacers 42 are at sidewalls of the cover 41 and an active component 61, which is disposed on the third doped region 213 having two doped areas 214, 215. The active component 61 includes a gate electrode and a gate oxide layer. In some embodiments, the active component 61 and the third doped region 213 are integrated as a transistor. In some embodiments, the electric conductivity type of the third doped region 213 is a p-type, while the doped areas 214, 215 are n-type semiconductors.

In some embodiments, the transistor is turned on by applying a predetermined positive voltage. When the transistor is turned on, an inversion layer is formed in the third doped region 213 and under the gate oxide layer. Electrons flow through this inversion layer between the source and the drain. At a reverse bias applying state (a state in which the source voltage is set to the ground electric potential and the drain voltage is set to the positive electric potential), a depletion layer is spread from the p-n junction either between the first doped region 211 and the semiconductor substrate 11 or between the second doped region 212 and the semiconductor substrate 11. The first doped region 211 and the second doped region 212 are depleted in order to sustain high breakdown voltage.

Figure 2:
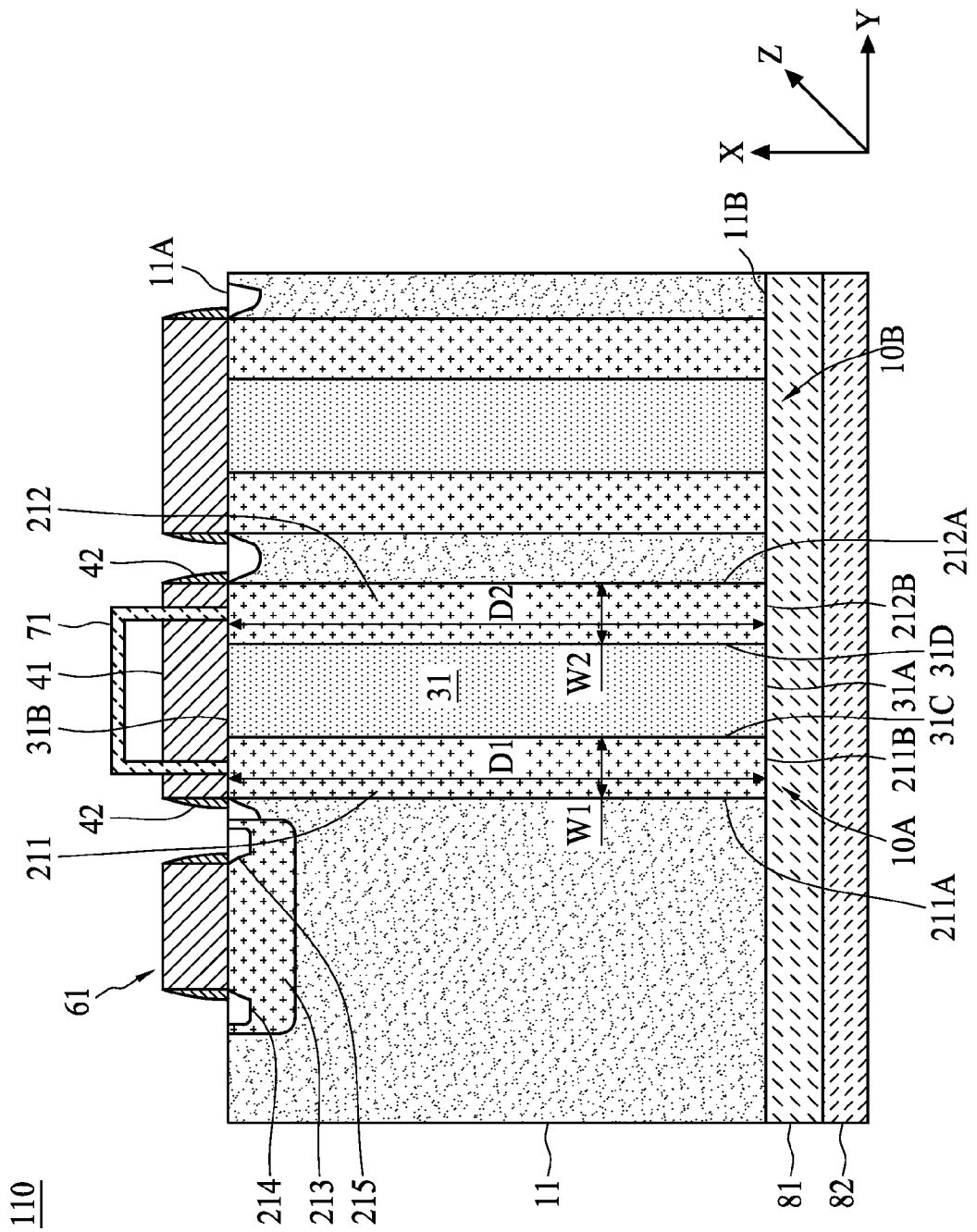
FIG. 2 is a cross-sectional view of an epitaxial layer and a conductive layer under a semiconductor substrate according to some embodiments of the present disclosure.

Referring to FIG. 2, a semiconductor structure 110 is provided. Elements with same labeling numbers as those in FIG. 1 are previously discussed with reference thereto and are not repeated here for simplicity. In FIG. 2, the semiconductor structure 110 further includes an epitaxial layer 81 and a conductive layer 82 positioned under the semiconductor substrate 11.

In some embodiments, EFD structure 10A is identical to EFD structure 10B, and hence the following description is directed to the EFD structure 10A, which includes the first doped region 211, the dielectric 31 and the second doped region 212. Since EFD structure 10A penetrates through the semiconductor substrate 11, the bottom surfaces 211B, 212B and 31A are in contact with the epitaxial layer 81.

The electric conductivity type of the epitaxial layer 81 is opposite to electric conductivity types of the first doped region 211, the second doped region 212 and the third doped region 213. In some embodiments, the electric conductivity type of the epitaxial layer 81 is an n-type, while the first doped region 211, the second doped region 212 and the third doped region 213 are p conductivity type semiconductors. In some embodiments, a bias is applied to the epitaxial layer 81 so as to remove accumulated charges around the p-n junction of the EFD structure 10A.

The conductive layer 82 is under the bottom surface 11B of the semiconductor substrate 11. Particularly, the conductive layer 82 is placed under the epitaxial layer 81. In some embodiments, a conductive layer 82 directly contacts with bottom surface 11B of semiconductor substrate 11 without interposing an epitaxial layer 81 there between. The material of the conductive layer 82 includes Aluminum (Al), Chromium (Cr), Gold (Au), Molybdenum (Mo), Platinum (Pt), Tantalum (Ta), Titanium (Ti), Copper (Cu) or Tungsten (W). Other materials are within the contemplated scope of present disclosure.

In some embodiments, the junction between the conductive layer 82 and the epitaxial layer 81 is, but not limited to, a Schottky barrier; hence, the junction is selected from a Schottky barrier, an ohmic contact, a tunnel junction and a heterojunction. Since the electrons of the epitaxial layer 81 flow to the conductive layer 82 through the Schottky barrier, the accumulated charges around the p-n junction of the EFD structure 10A is removed. In other embodiments, the bias removing the accumulated charges is applied to the conductive layer 82 for removal of the accumulated charges.

Figure 3:
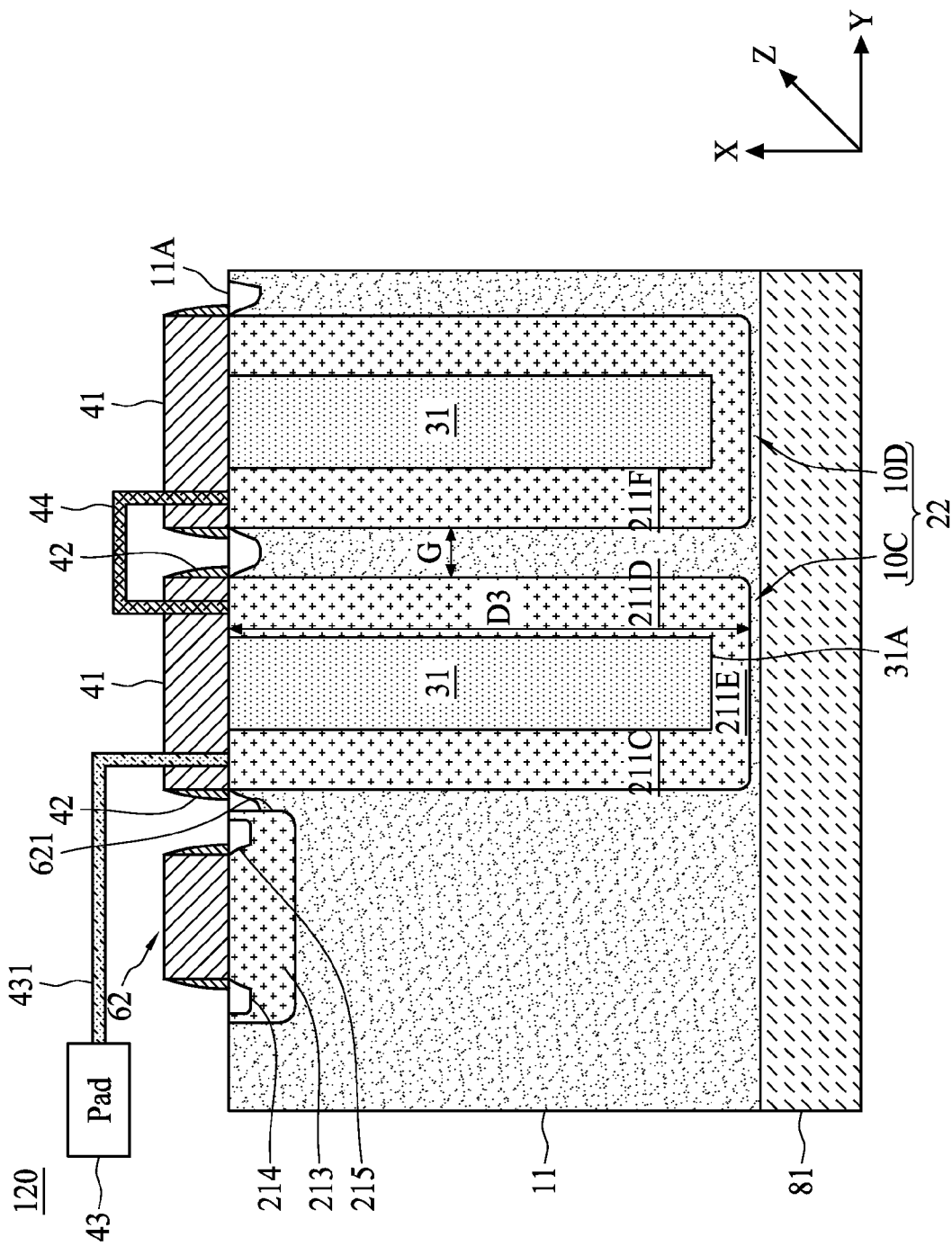
FIG. 3 is a cross-sectional view of another semiconductor structure with a pad according to some embodiments of the present disclosure.

Referring to FIG. 3, a semiconductor structure 120 is provided. Elements with same labeling numbers as those in FIG. 2 are previously discussed with reference thereto and are not repeated here for simplicity. In some embodiments, the semiconductor structure 120 includes a transistor 62 and a p-n junction string 22, which has several EFD structures such as 10C, 10D and other EFD structures. In some embodiments, structures of the two adjacent EFD structures 10C and 10D are identical, and hence the following description is directed to the EFD structure 10C. A pad 43 is over the semiconductor substrate 11.

In some embodiments, the p-n junction string 22 is electrically coupled to the transistor 62 at one end 621 and the p-n junction string 22 is spaced from the transistor 62 by a predetermined distance. In some embodiments, the distance is between about 1 μm and about 10 μm. In certain embodiments, the distance is between about 0.5 μm and about 7.8 μm. In other embodiments, the distance is between about 1.7 μm and about 6.9 μm. In some other embodiments, the distance is between about 3.3 μm and about 4.6 μm. The foresaid distance is short enough to miniaturize the semiconductor structure 120 and long enough to prevent permanent break down from occurring.

In some embodiments, in the p-n junction string 22, a predetermined gap G is between adjacent EFD structures 10C and 10D. In some embodiments, the gap G is between about 2 μm and about 20 μm. In certain embodiments, the gap G is between about 0.5 μm and about 22.8 μm. In other embodiments, the gap G is between about 1.7 μm and about 13.1 μm. In some other embodiments, the gap G is between about 5.3 μm and about 17.6 μm. The gap G is able to increase the contacting area of the p-n junction in order to evenly distribute the electric field therein.

In some embodiments, a doped strip 211C is a portion of the EFD structure 10C and forms a p-n junction with the semiconductor substrate 11. The doped strip 211C is similar to the first doped region 211, which is previously discussed with reference in FIGS. 1 and 2 and is not repeated here for simplicity. In FIG. 3, the EFD structure 10C further includes a doped strip 211D and a coupling region 211E. The doped strip 211D is similar to the second doped region 212, which is previously discussed with reference in FIGS. 1 and 2 and is not repeated here for simplicity.

In some embodiments, the doped strip 211D and the doped strip 211C have the same aspect ratio. In some embodiments, the aspect ratio of the doped strip 211C or the doped strip 211D is between about 40:1 to about 10:1. In certain embodiments, the aspect ratio of the doped strip 211C or the doped strip 211D is between about 310:1 to about 11:1. In some other embodiments, the aspect ratio of the doped strip 211C or the doped strip 211D is between about 138.1:1 to about 17.5:1. In other words, the aspect ratio of the doped strip 211C or the doped strip 211D in the semiconductor substrate 11 is greater than about 10. In some embodiments, the dopant concentration uniformity along the X axis of the doped strip 211C and doped strip 211D is within 0.2%.

In some embodiments, in order to prevent simultaneously depleting the p-n junction, the gradient of dopant distribution in the doped strip 211D is greater or smaller than the gradient of dopant distribution of the doped strip 211C. Due to the different impurity gradient, a spread speed of the depletion layer is different (the spread speed is fast as concentration is low, while the spread speed is slow as concentration is high). Therefore, timing for perfectly depleting the p-n junctions is shifted along the Y axis, and it prevents all p-n junctions from simultaneously turning off. As a result, a changing ratio with respect to an electric current between the drain and the source at a switching time from an on-state to an off-state is reduced, and jumping-up of a voltage between the drain and the source at the switching time from an on-state to an off-state is deferred.

In some embodiments, the electric conductivity types of the coupling region 211E, the doped strip 211C and the doped strip 211D are opposite to the electric conductivity type of the semiconductor substrate 11. The p-n junction between the doped strip 211C and the semiconductor substrate 11 and the p-n junction between the doped strip 211D and the semiconductor substrate 11 are electrically connected through the p-n junction between the coupling region 211E and the semiconductor substrate 11. Thus, the coupling region 211E is used to distribute the electric field more evenly in those p-n junctions.

In some embodiments, a pad 43 is electrically coupled to the p-n junction string 22, which is designed to sustain a high breakdown voltage. The pad 43 is configured to receive a voltage greater than 100 V. In some embodiments, the voltage is between about 115 V and about 2000 V. In certain embodiments, the voltage is between about 309 V and about 2500 V. In other embodiments, the voltage is between about 210 V and about 800 V. In some other embodiments, the voltage is between about 610 V and about 1800 V.

In some embodiments, an electric line 431 electrically connects the pad 43 and the doped strip 211C. The electric line 431 penetrates through the cover 41. The voltage applied to the p-n junction string 22 is through the electric line 431. In certain embodiments, the electric line 431 is electrically connected to the transistor 62 and hence the foresaid voltage is applied to the transistor 62 through the electric line 431.

A conductive line 44 electrically connects the EFD structure 10C and the EFD structure 10D. The conductive line 44 is disposed over the semiconductor substrate 11. In some embodiments, conductive line 44 is disposed on the top surface 11A of the semiconductor substrate 11. The conductive line 44 allows the electric field to be evenly distributed in the p-n junction string 22.

Figure 4:
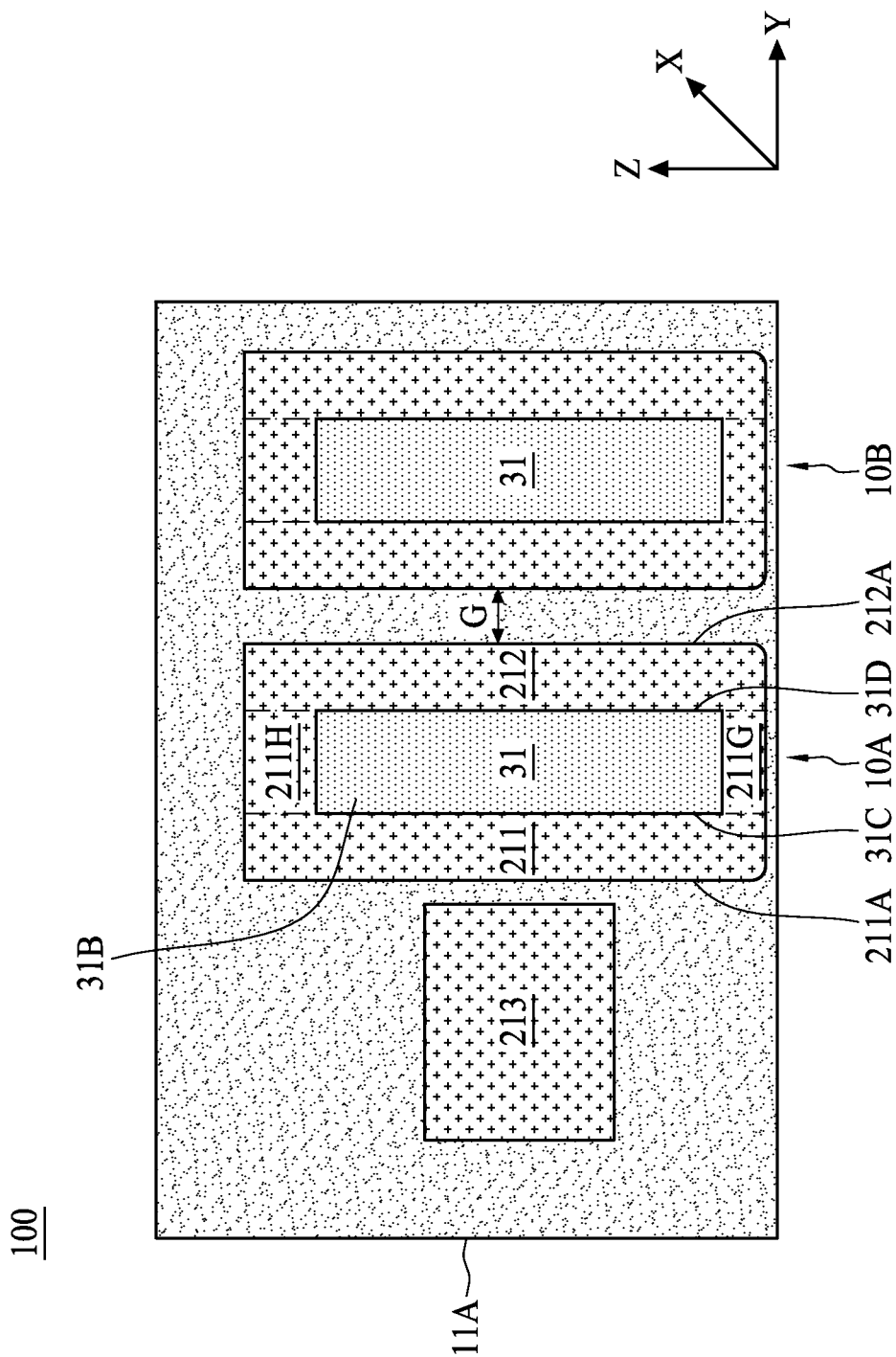
FIG. 4 is a top view of two EFD structures in a semiconductor structure according to some embodiments of the present disclosure.

FIG. 4 is a top view of a portion of the semiconductor structure 100 in FIG. 1, and elements with same labeling numbers as those in FIG. 1 are previously discussed with reference thereto and are not repeated here for simplicity. In FIG. 4, the semiconductor structure 100 includes two EFD structures 10A and 10B that are separated by a gap G. A cover 41, spacers 42, an interconnect 71 and an active component 61 are ignored in order to show the connecting regions 211G and 211H, the dielectric 31 and the top surface 11A. The EFD structure 10A includes a loop formed by the first doped region 211, the second doped region 212 and the connecting regions 211G, 211H. The dielectric 31 is located inside the loop.

In some embodiments, the connecting regions 211G and 211H extend along the X axis. In some embodiments, the electric conductivity type of the loop is a p-type while the electric conductivity type of the semiconductor substrate 11 is an n-type. The interface between the loop and the semiconductor substrate is a continuous p-n junction.

Figure 5:
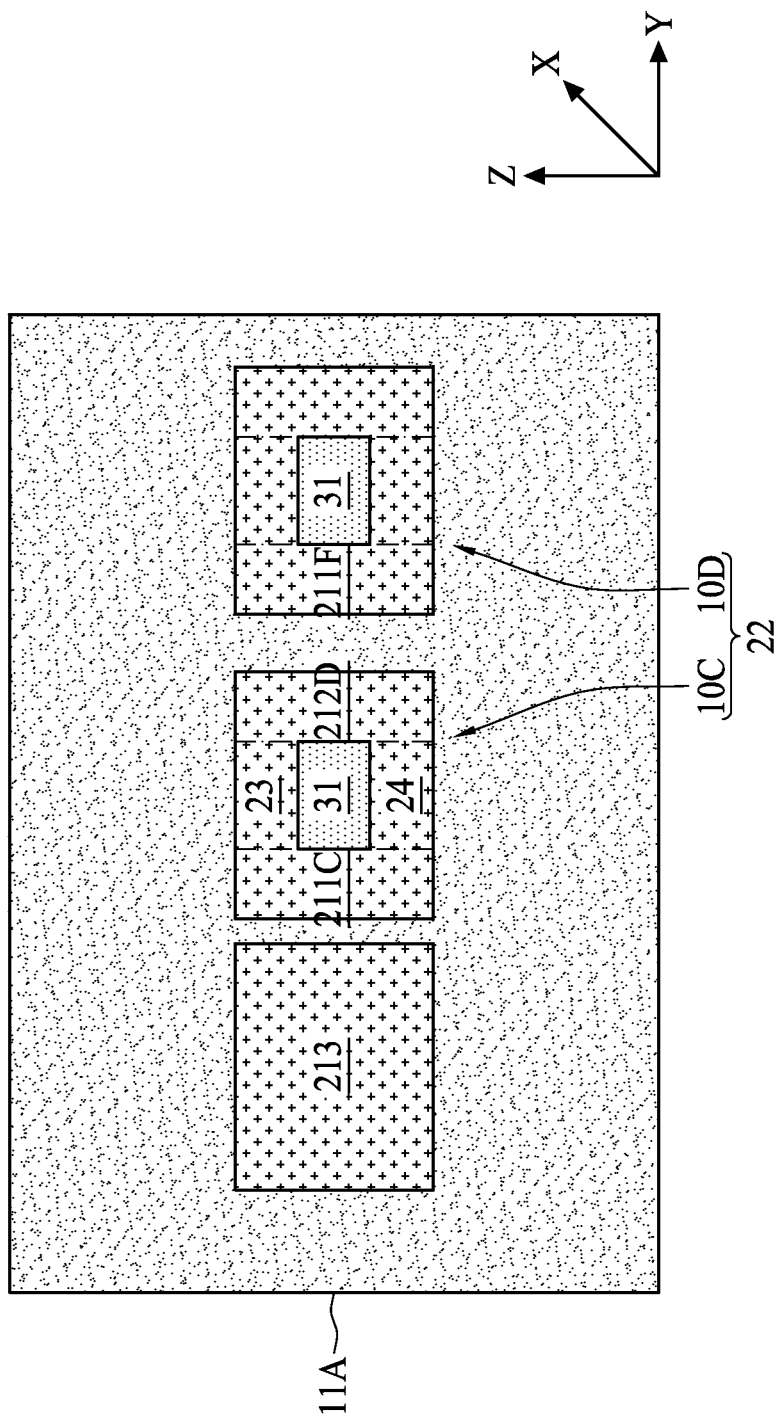
FIG. 5 is a top view of other EFD structures in a semiconductor structure according to some embodiments of the present disclosure.

FIG. 5 is a top view of a portion of the semiconductor structure 120 in FIG. 3, in which elements with same labeling numbers as those in FIG. 3 are previously discussed with reference thereto and are not repeated here for simplicity. Referring to FIG. 5, a semiconductor structure 120 includes two EFD structures 10C, 10D and a third doped region 213.

In some embodiments as in FIG. 5, the two EFD structures 10C, 10D are symmetric, and hence the following description is directed to the EFD structure 10C. The EFD structure 10C includes a loop formed by doped strips 211C and 211D and connecting regions 23 and 24.

In some embodiments, the connecting regions 23 and 24 have the same electric conductivity types as the doped strip 211C and the doped strip 211D. In certain embodiments, the loop is a p-type while the electric conductivity type of the semiconductor substrate is an n-type. The interface between the loop and the semiconductor substrate is a continuous p-n junction.

A method for manufacturing a semiconductor structure, which is similar to a super junction string, is designed for obtaining the high breakdown voltage. The method includes a number of operations and the description and illustration are not deemed as a limitation as the order of the operations.

A term "receiving" or "received" is used in the present disclosure to describe an operation of locating an object to a specific site such as a chuck. The providing operation includes various steps and processes and varies in accordance with the features of embodiments. In some embodiments, a receiving operation includes holding a semiconductor substrate or a wafer for further spinning motion. In certain embodiments, a receiving operation includes spinning a semiconductor substrate or a wafer in a vacuum condition.

A term "inserting" or "inserted" is used in the present disclosure to describe an operation of incorporating an impurity into an object. The inserting operation includes various steps and processes and varies in accordance with the features of embodiments. In certain embodiments, the inserting operation includes ion-implanting the dopants in to the object. In some embodiments, the inserting operation includes pre-depositing the dopants into the object. For instance, the pre-deposition uses boron-based gas, such as $B_2H_6$, $BCl_3$, $BF_3$ and $BH_3$ within a temperature from about 600° C. to about 1200° C., within about 200 to about 400 seconds (about 50 to about 100 CC) for forming a P-well or a p-n junction string formation in an n-type semiconductor substrate. In some embodiments, the pre-deposition uses phosphorus-based gas, such as $PH_3$, $POCl_3$, and $PF_3$ within a temperature from about 600° C. to about 1200° C., within about 200 to about 400 seconds (about 50 to about 100 CC) for forming a N-well or a p-n junction string formation in a p-type semiconductor substrate. In the present disclosure, the high and low temperatures are traded off for a short duration and a long duration of the operation, respectively.

A term "filling" or "filled" is used in the present disclosure to describe an operation of placing a material into a vacancy. The filling operation includes various steps and processes and varies in accordance with the features of embodiments. In some embodiments, the filling operation includes depositing the dielectric into a trench as an isolation structure. In certain embodiments, the filling operation includes epitaxially growing the dielectric in the trench.

A term "driving" or "driven" is used in the present disclosure to describe an operation of diffusing a material toward a distance. The driving operation includes various steps and processes and varies in accordance with the features of embodiments. In certain embodiments, the driving operation includes implanting dopants into a substrate in the distance. In some embodiments, the driving operation includes diffusing the impurity into a substrate. For instance, the driving operation is operated in a temperature from about 1000° C. to about 1200° C., within about 100 to about 300 minutes. In the present disclosure, the high and low temperatures are traded off for a short duration and a long duration of the operation, respectively.

Figure 6:
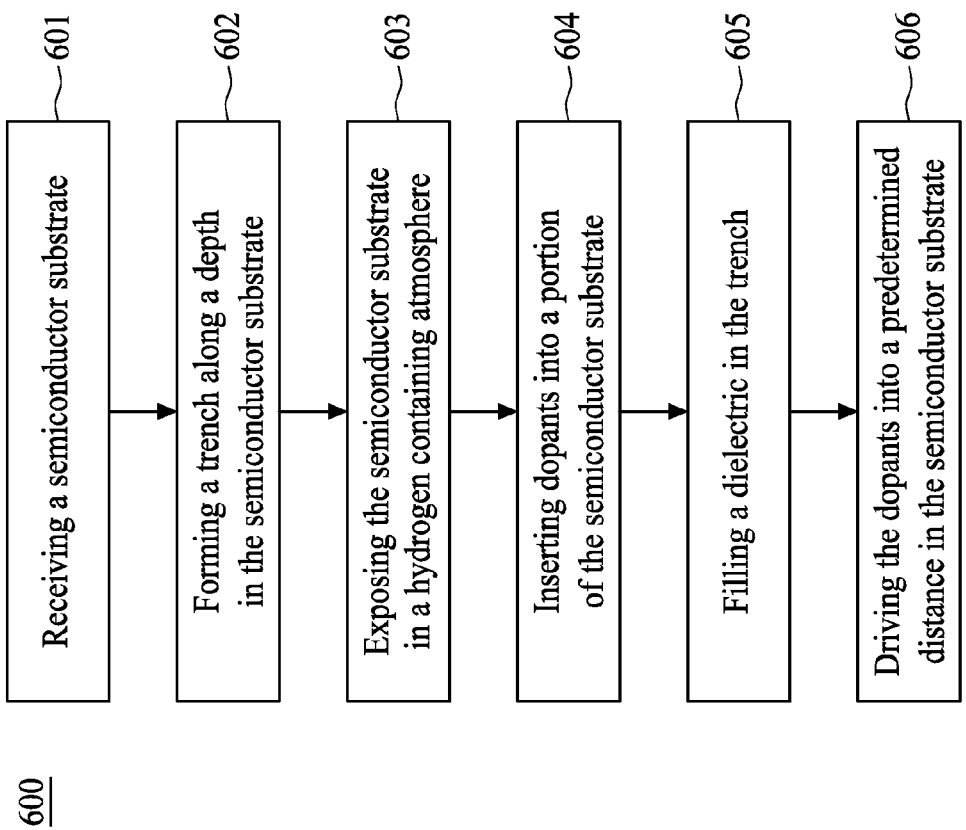
FIG. 6 is a flowchart of a method in fabricating a semiconductor structure according to some embodiments of the present disclosure.

FIG. 6 is a diagram of a method 600 for fabricating a semiconductor structure in accordance with some embodiments of the present disclosure. The method 600 includes several operations, which are discussed in detail with reference to FIGS. 7 to 19. At operation 601, a semiconductor substrate is received. At operation 602, a trench is formed along a depth in the semiconductor substrate. At operation 603, the semiconductor substrate is exposed in a hydrogen containing atmosphere. At operation 604, dopants are inserted into a portion of the semiconductor substrate. At operation 605, a dielectric is filled in the trench. At operation 606, dopants are driven into a predetermined distance in the semiconductor substrate.

FIGS. 7 to 19 have been simplified for a better understanding of the inventive concepts of the present disclosure. In FIGS. 7 to 19, elements with same labeling numbers as those in FIG. 1 to FIG. 5 are previously discussed with reference thereto and are not repeated here for simplicity.

Figure 7:
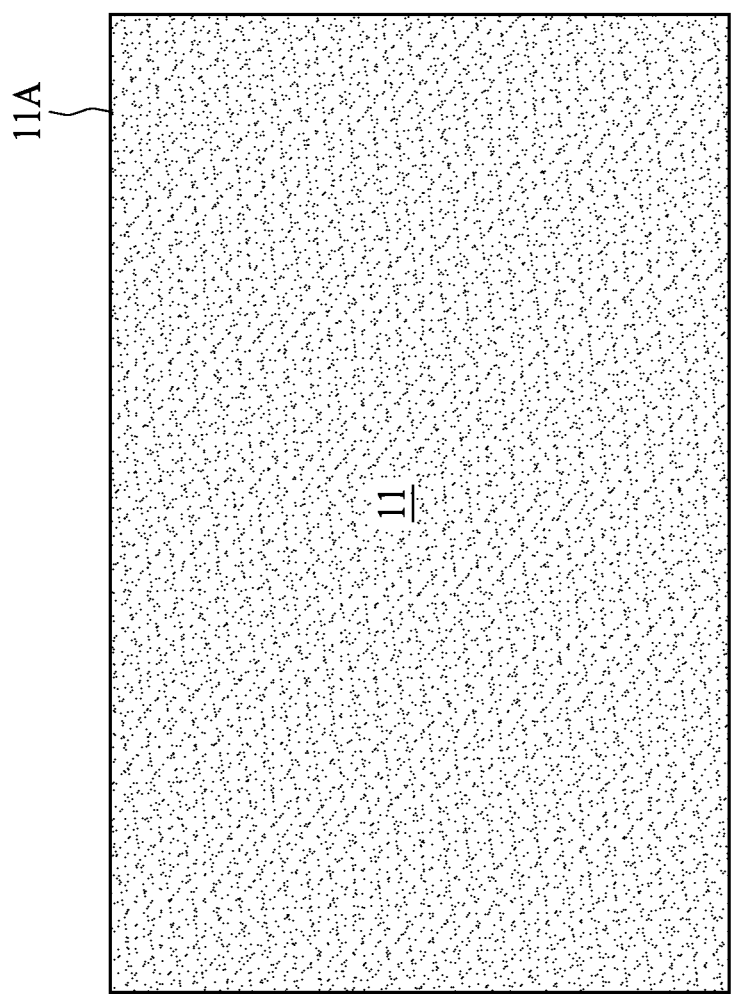
FIGS. 7 to 19 are cross-sectional views corresponding to various operations 601 to 605 in FIG. 6.
Figure 8:
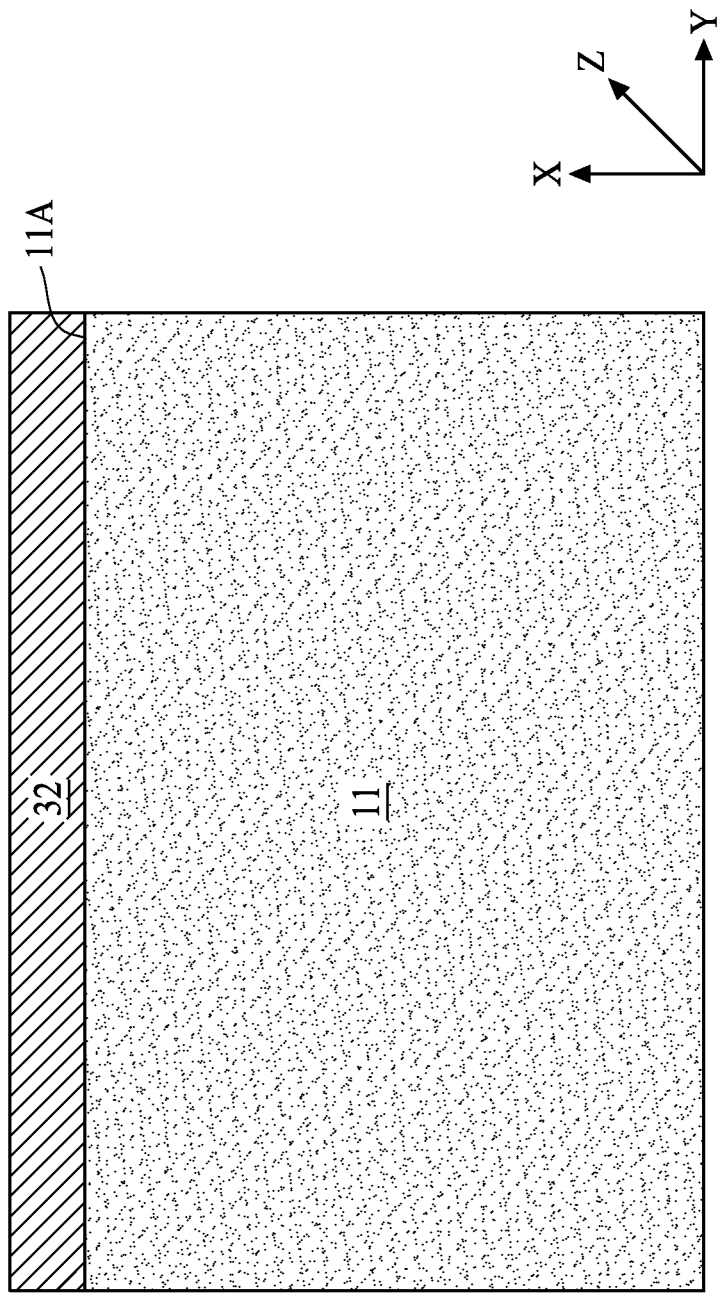
Figure 9:
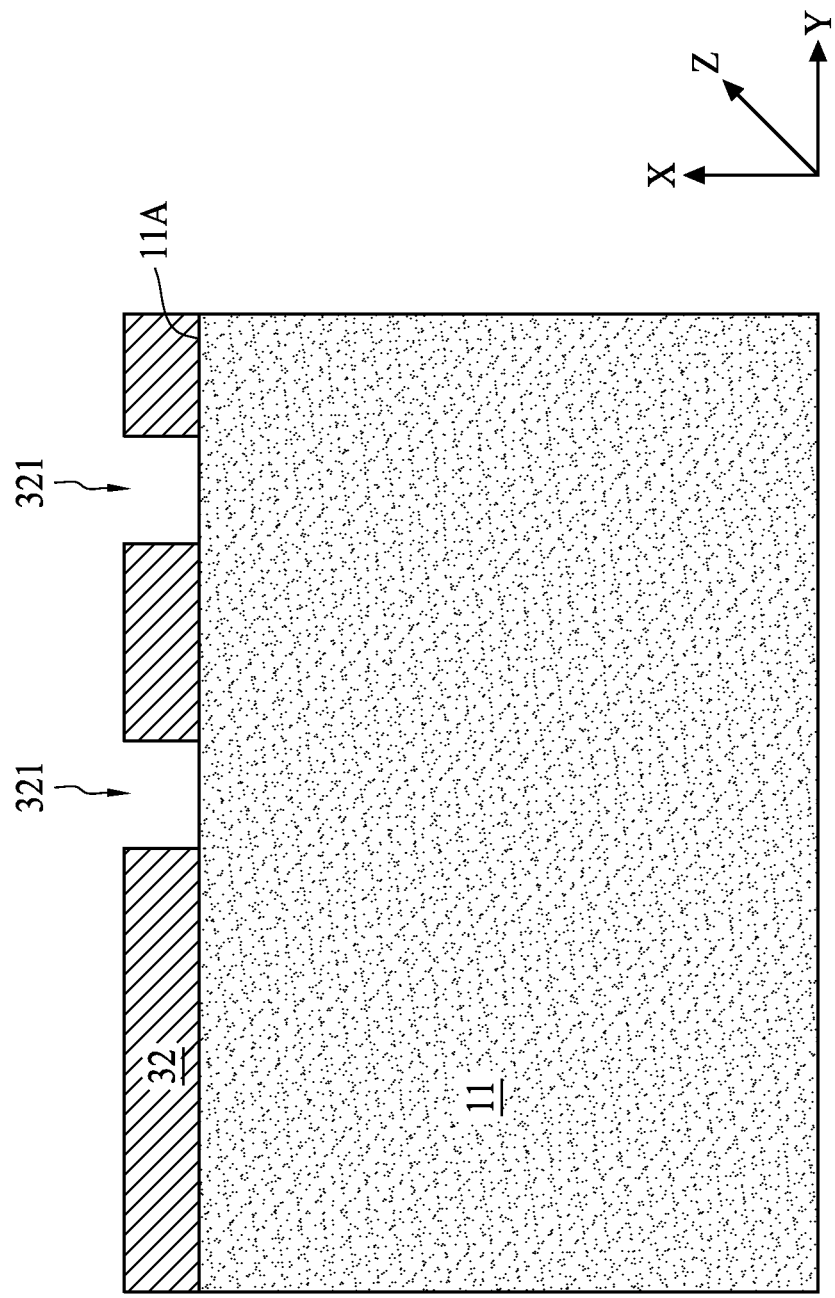

Referring to FIG. 7, the semiconductor substrate 11 is received at a location, such as a chuck. A mask layer 32 is formed on the top surface 11A of the semiconductor substrate 11 as shown in FIG. 8. The material of the mask layer 32 is selected from the previously discussed oxide and nitride. A portion of the mask layer 32 is removed and then two openings 321 are formed therein and expose the top surface 11A as shown in FIG. 9. Trenches 51 are formed as in FIG. 10, and locations of the trenches 51 follow a footprint of an opening 321 in FIG. 9.

In some embodiments, the semiconductor substrate 11 with trenches 51 is exposed in a hydrogen containing atmosphere. A percentage of the hydrogen containing atmosphere is predetermined from about 10% to about 50%. In certain embodiments, the percentage of the hydrogen containing atmosphere is from 15% to about 47%. In other embodiments, the percentage of the hydrogen containing atmosphere is from 21% to about 39%. In some certain embodiments, the percentage of the hydrogen containing atmosphere is from 31% to about 35%. In addition, the hydrogen containing atmosphere assists impurities from the above-mentioned boron-based gas or phosphorus-based gas to insert into the semiconductor substrate 11, instead of inserting itself into the semiconductor substrate 11.

In some embodiments, trenches 51 are formed through a DRIE etching method (Semiconductor And Telecommunications Co., Ltd.). In some embodiments, the width W of the trench 51 is between about 2 μm and about 30 μm. In certain embodiments, the width W is between about 4.3 μm and about 70 μm. In other embodiments, the width W is between about 1.7 μm and about 11 μm. In some other embodiments, the width W is between about 0.5 μm and about 5.6 μm.

In some embodiments the depth D of the trench 51 is greater than about 15 μm. In certain embodiments, the depth D is between about 18 μm and 330 μm. In other embodiments, the depth D is between about 27.5 μm and about 180 μm. In some other embodiments, the depth D is between about 87.7 μm and about 130.6 μm. In some embodiments, the depth D is too deep to ion-implant impurity into a portion 52 of the semiconductor substrate 11 surrounding the trench 51 and short enough to use a gas doping method to insert dopants into the portion 52 of the semiconductor substrate 11 as shown in FIG. 11.

According to some embodiments in the present disclosure, the aspect ratio of the trench 51 is between about 45:1 to about 21:1. In certain embodiments, the aspect ratio of the trench 51 is between about 145:1 to about 15:1. In some other embodiments, the aspect ratio of the trench 51 is between about 210:1 to about 12:1. In other words, the aspect ratio of the trench 51 in the semiconductor substrate 11 is greater than about 10.

Figure 11:
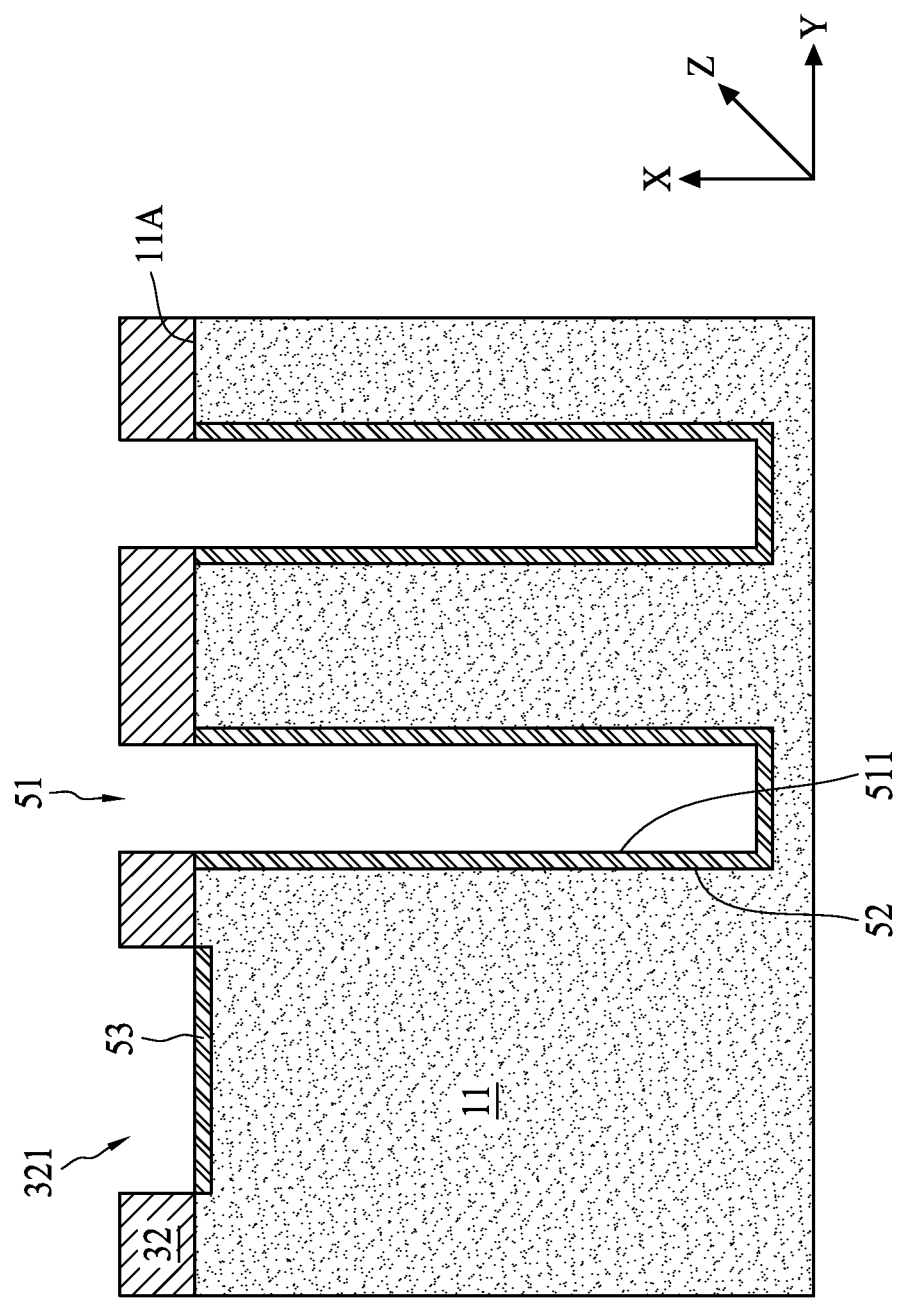

FIG. 11 is an illustration showing dopant insertion into a portion 52 of the semiconductor substrate 11. The portion 52 of the semiconductor substrate 11 surrounds the trench 51. An opening 321 is also designed to simultaneously insert dopants into a portion 53 of the semiconductor substrate 11, thereby forming either a p-well or an n-well. Dopant insertion is conducted by various processes such as diffusion or ion implantation. In some embodiments, the dopant insertion is performed at a temperature range from about 600° C. to about 1050° C., while the duration of the operation 603 ranges from about 380 to about 400 seconds. In certain embodiments, the operation 603 is performed at a temperature range from about 1180 to about 1200° C., while the duration of the operation 603 ranges from about 200 to about 230 seconds.

Figure 12:
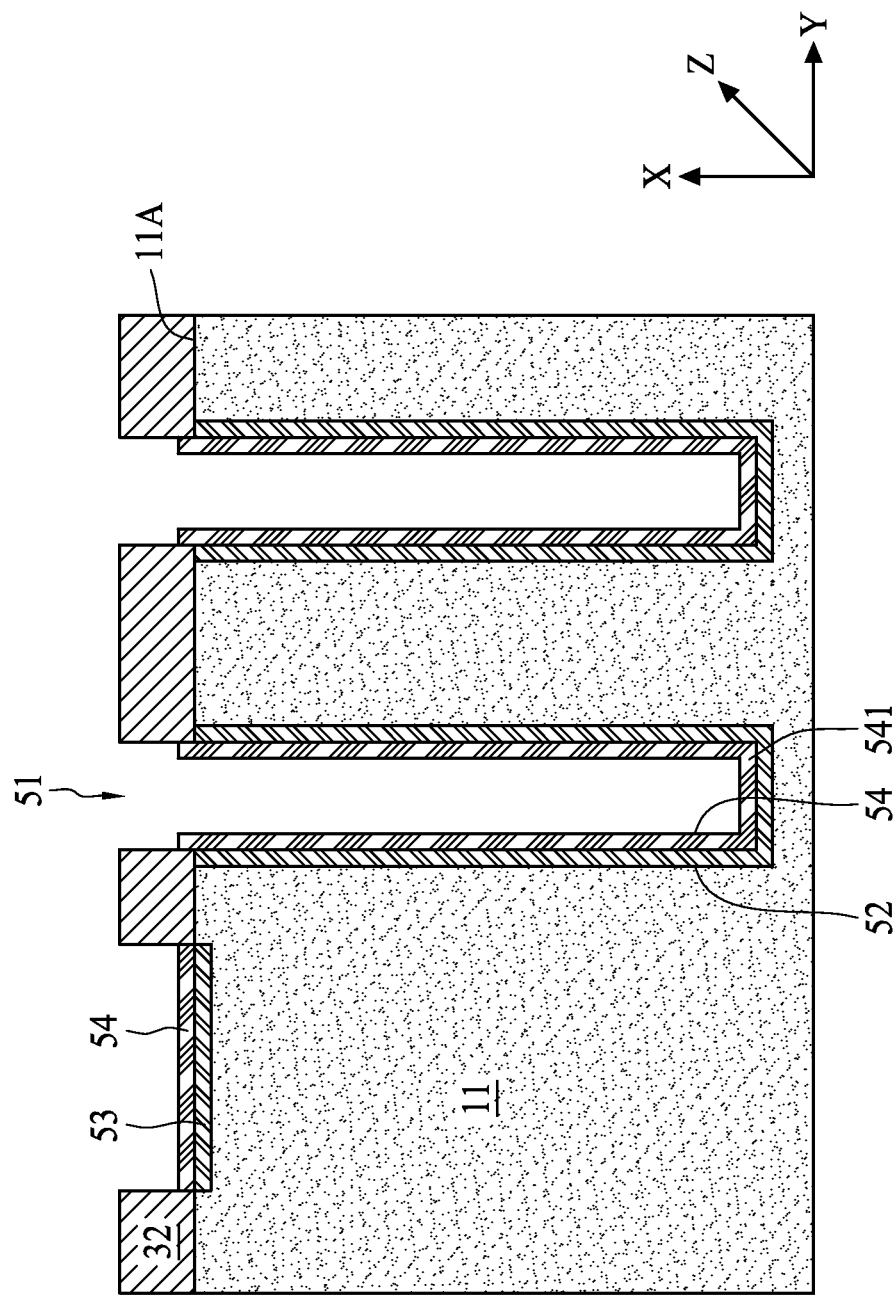

In some embodiments, the method 600 further includes an operation of forming a liner 54 on the portions 52 and 53 of the semiconductor substrate 11 as shown in FIG. 12. The liner 54 is made of various dielectric materials as previously discussed. In some embodiments, the liner 54 forming operation is performed by a 1K to 2K TEOS oxide deposition so as to form a liner 54. In some embodiments as in FIG. 13, the method 600 further includes an operation of removing a portion 541 (referring to FIG. 12) of the liner 54. The portion 541 of the liner 54 is on a bottom of the trench 51. In some embodiments, the liner 54 removing operation is performed by an etch. In certain embodiments as in FIG. 14, the method 600 further includes an operation of removing an amount of the semiconductor substrate 11 on the bottom of the trench 51. The amount of the semiconductor substrate 11 is doped. The semiconductor substrate 11 removing operation is performed by an etch that has a selectivity between the semiconductor substrate 11, such as silicon, and the liner 54, such as a dielectric. The etch removes about 1 μm of the semiconductor substrate 11 and divides the portion 52 into two pieces.

Figure 14:
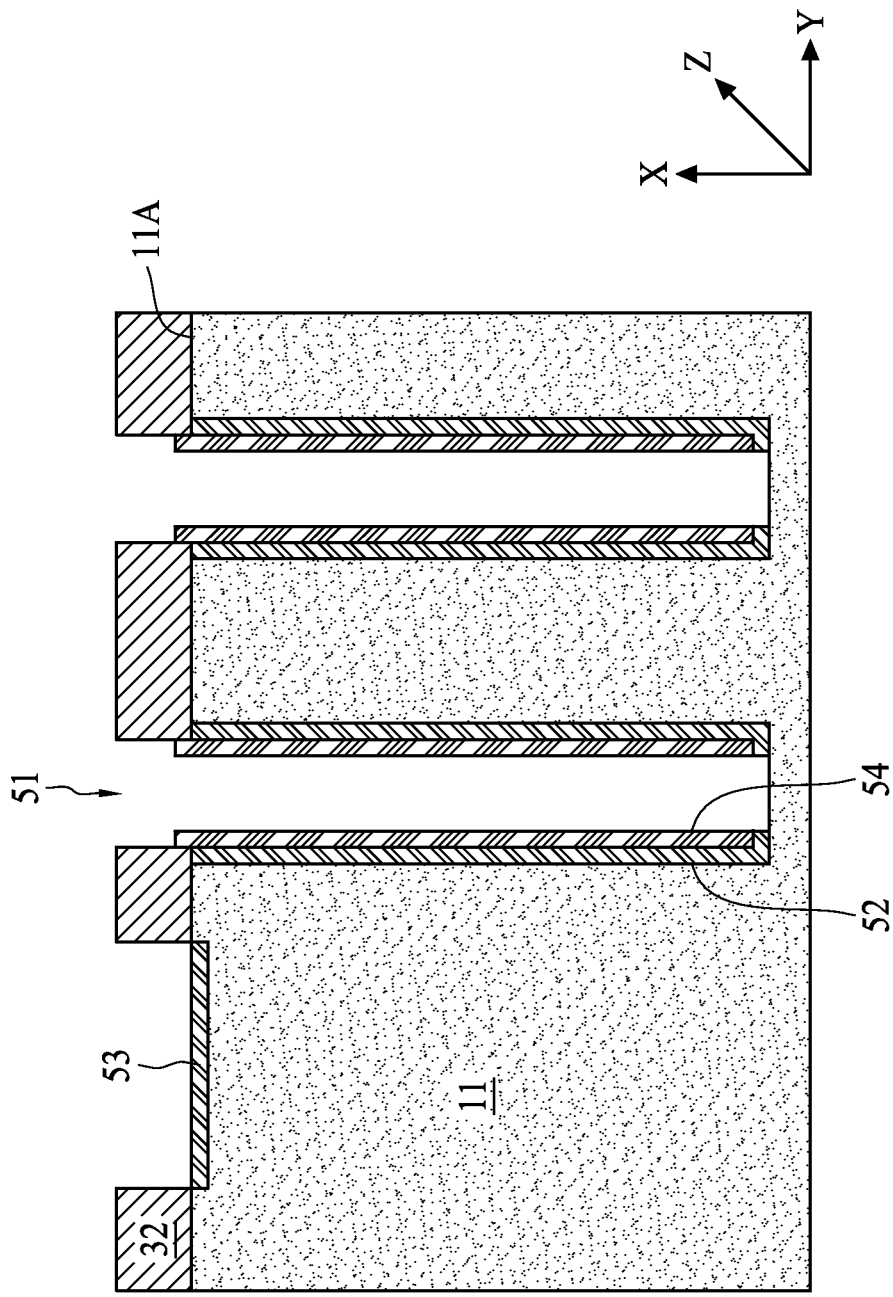
Figure 15:
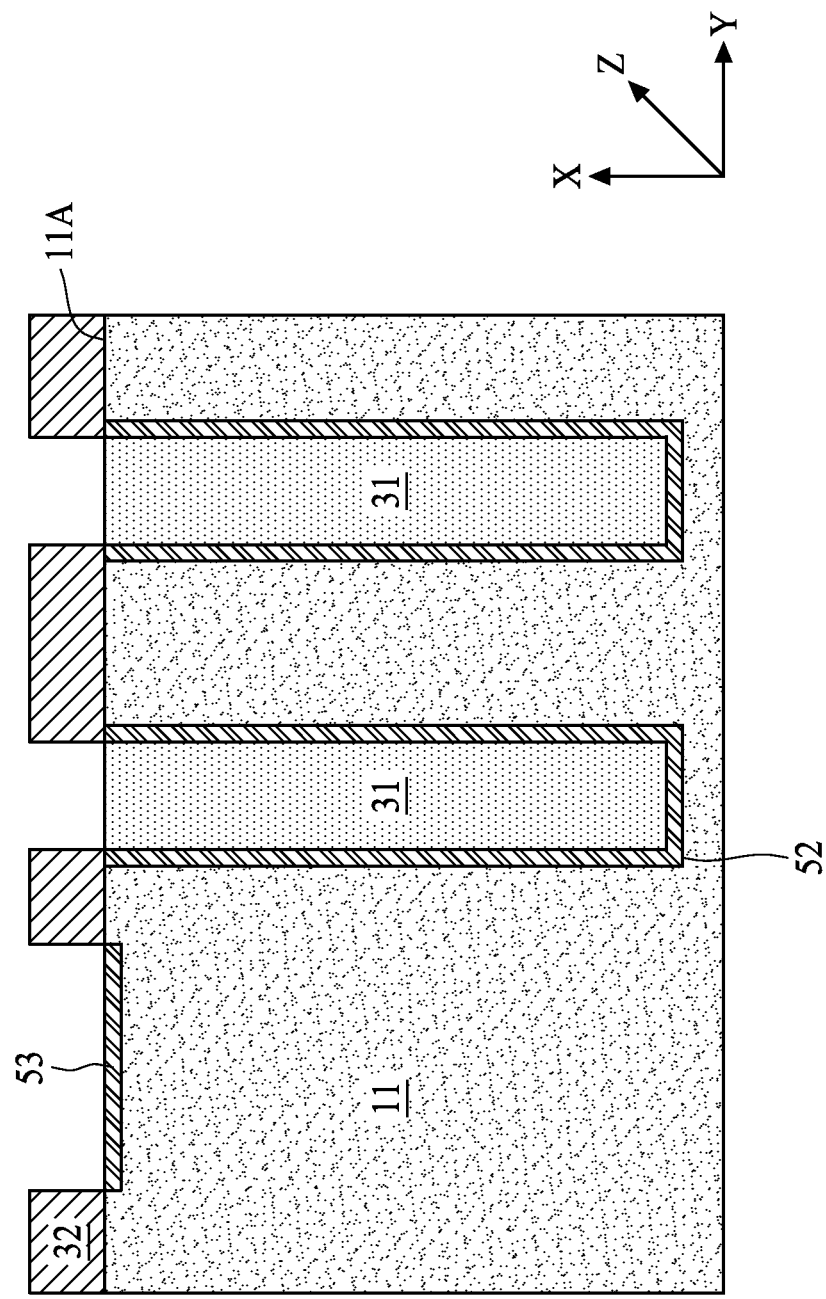
Figure 16:
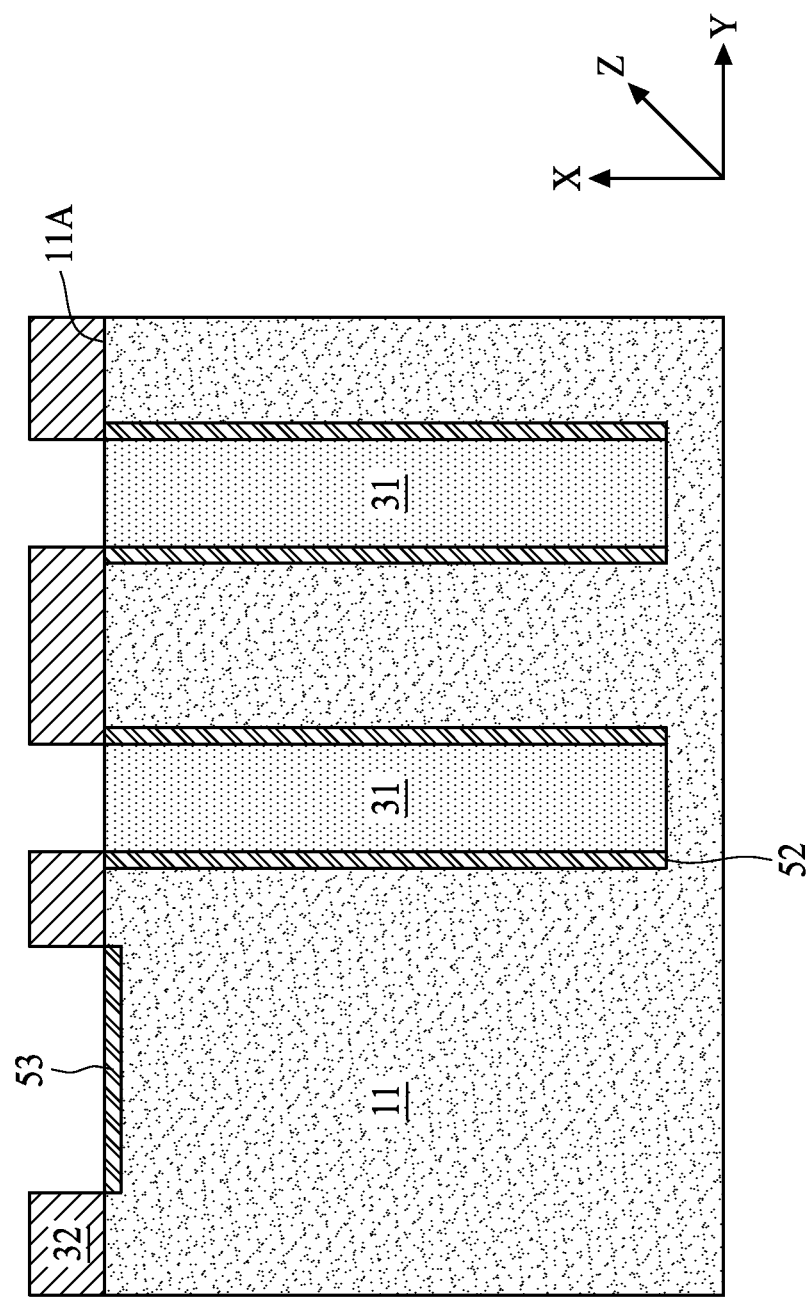

Referring to FIG. 15, the dielectric 31 fills in the trench 51 as shown in FIG. 11 in order to form an isolation. In some embodiments, the dielectric 31 is filled by thermal oxidation or vapor deposition. Referring to FIG. 16, the dielectric 31 fills in the trench 51 as shown in FIG. 14 in order to form an isolation.

Figure 17:
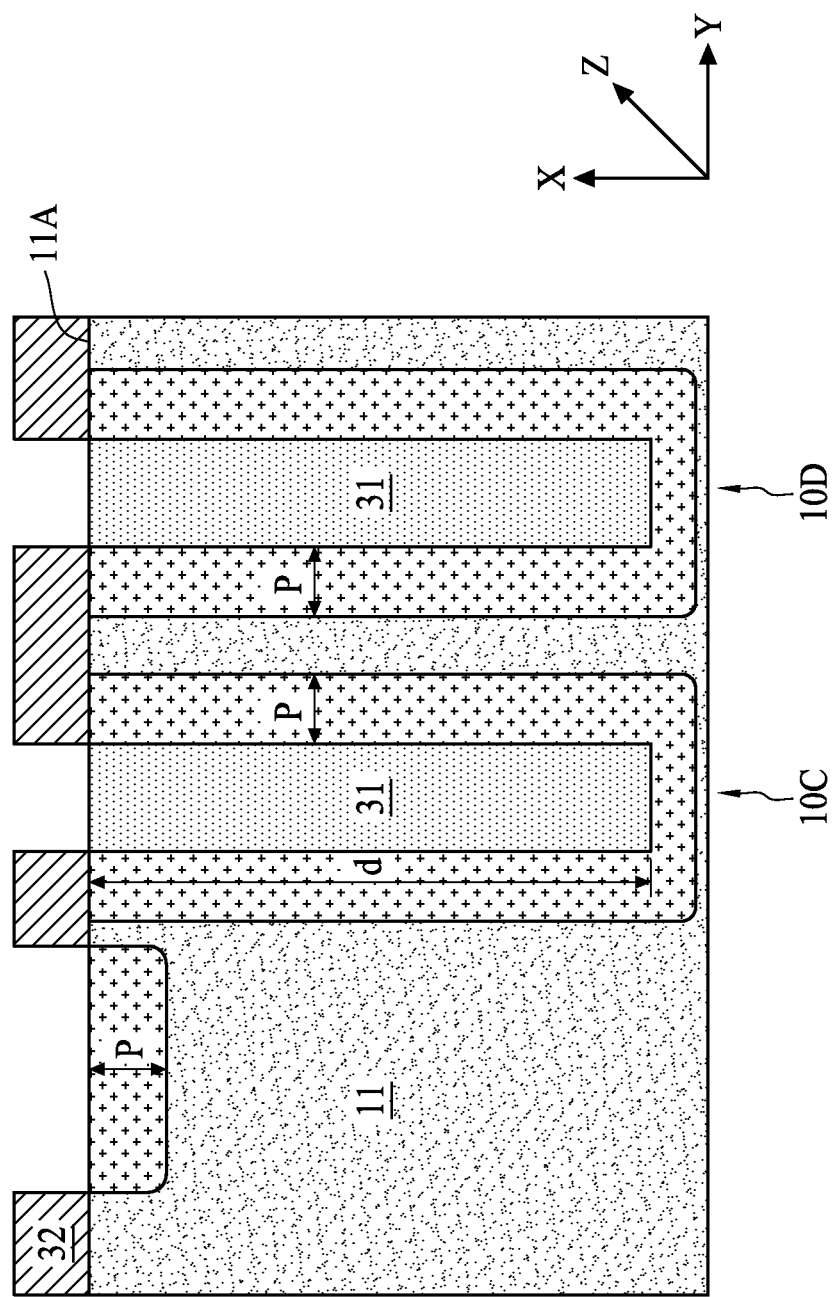
Figure 18:
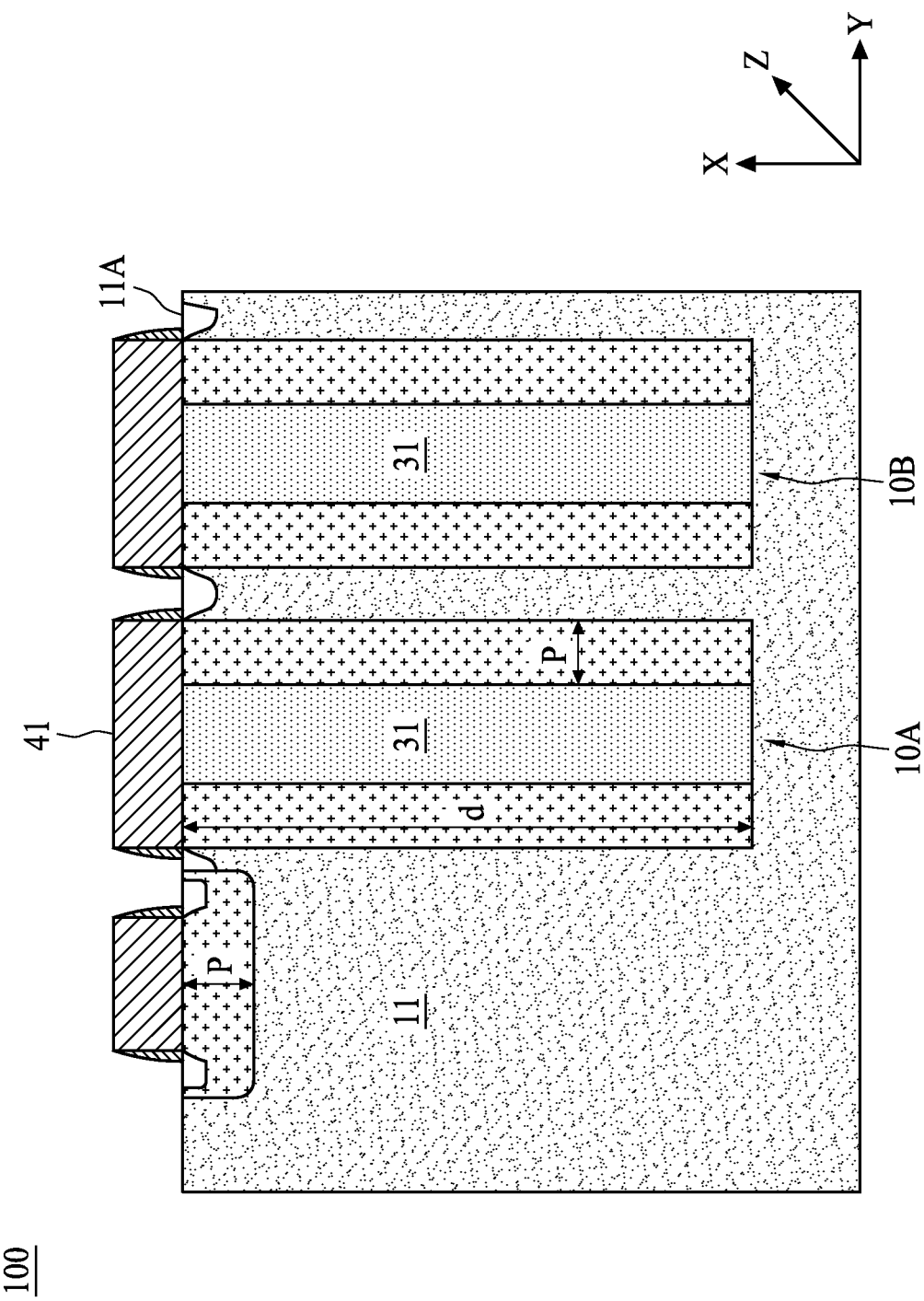
Figure 19:
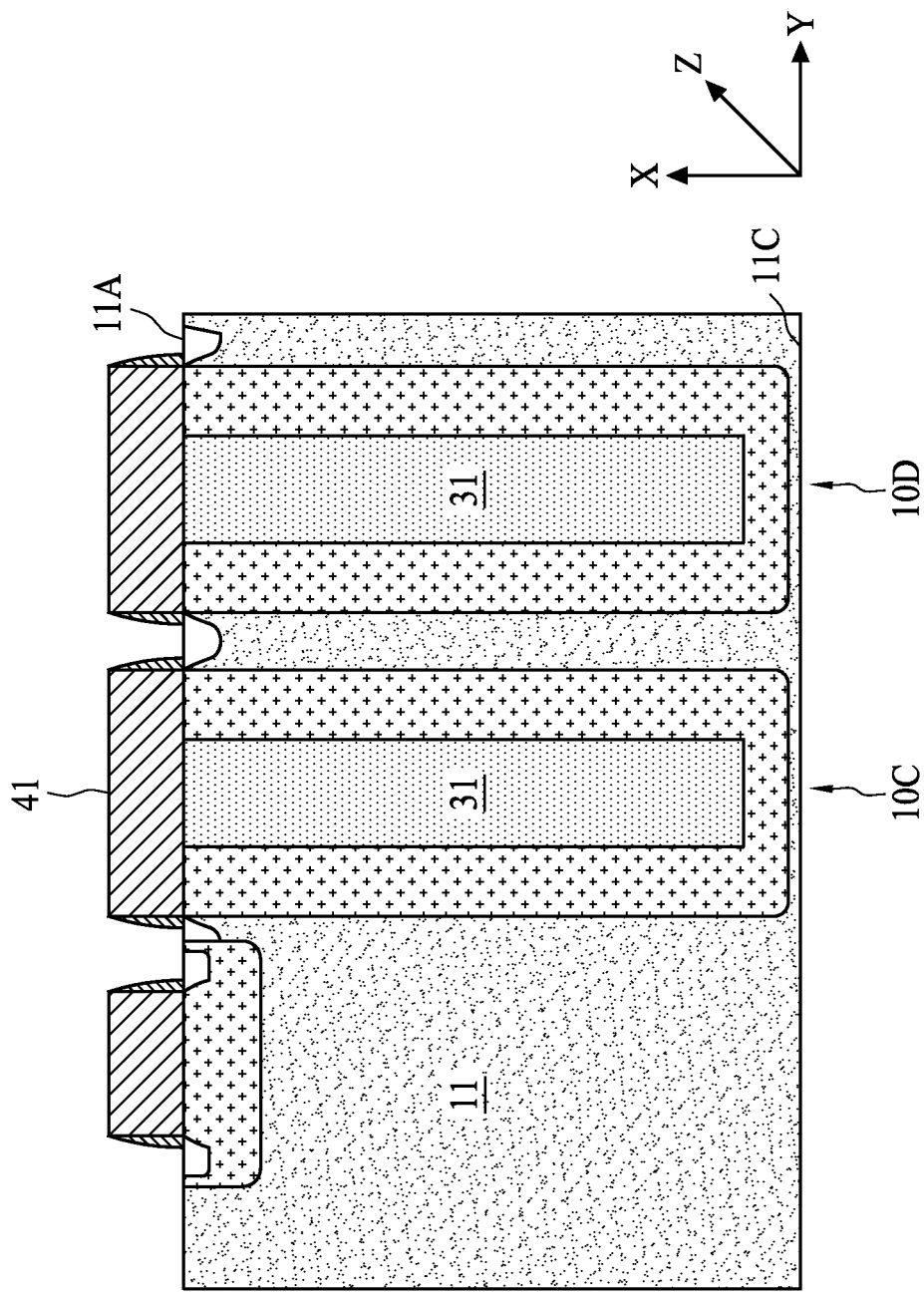

A drive-in is introduced to drive the dopants into a predetermined distance P in order to form structures as shown in FIGS. 17 and 18. The dopant concentration uniformity along the depth d is within 0.2%. In some embodiments, the drive-in is performed at a temperature range from about 600° C. to about 1050° C., while the duration of the drive-in ranges from about 280 to about 300 minutes. In certain embodiments, the drive-in is performed at a temperature range from about 1180° C. to about 1200° C., while the duration of the operation 605 ranges from about 200 to about 230 minutes. After removing the mask layer 32 and forming the cover 41 on the top surface 11A or over the dielectric 31, the semiconductor structure 100 is completed as shown in FIG. 18. In some embodiments, after the drive-in is performed as shown in FIG. 19, a backside 11C of the structure is grinded and then the epitaxial layer 83 is attached under the semiconductor substrate 11 so as to form the semiconductor structure 120 referred to in FIG. 3.

Figure 20:
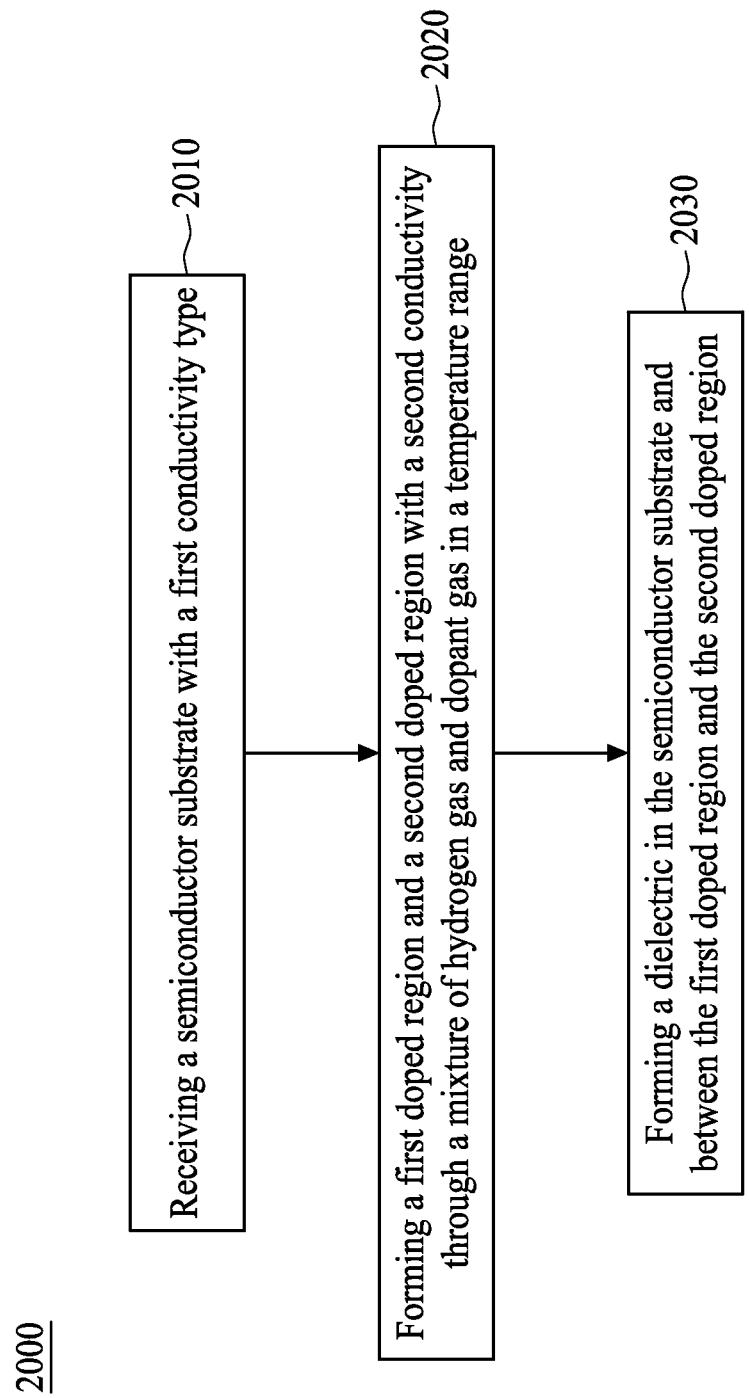
FIG. 20 is a flowchart of a method in manufacturing a semiconductor structure according to some embodiments of the present disclosure.

FIG. 20 is a diagram of a method 2000 for manufacturing a semiconductor structure in accordance with some embodiments of the present disclosure. The method 2000 includes several operations. At operation 2010, a semiconductor substrate with a first conductivity type is received. At operation 2020, a first doped region with a second conductivity type and a second doped region with a second conductivity type in the semiconductor substrate are formed through a mixture of hydrogen gas and dopant gas in a predetermined temperature range. At operation 2030, a dielectric is formed in the semiconductor substrate and between the first doped region and the second doped region. In addition, the first doped region and the second doped region are symmetrical with reference to the dielectric and have an aspect ratio, respectively. The aspect ratio is greater than about 10. Thus, the first doped region and the second doped region have a dopant concentration uniformity along a depth in the semiconductor substrate.

Figure 10:
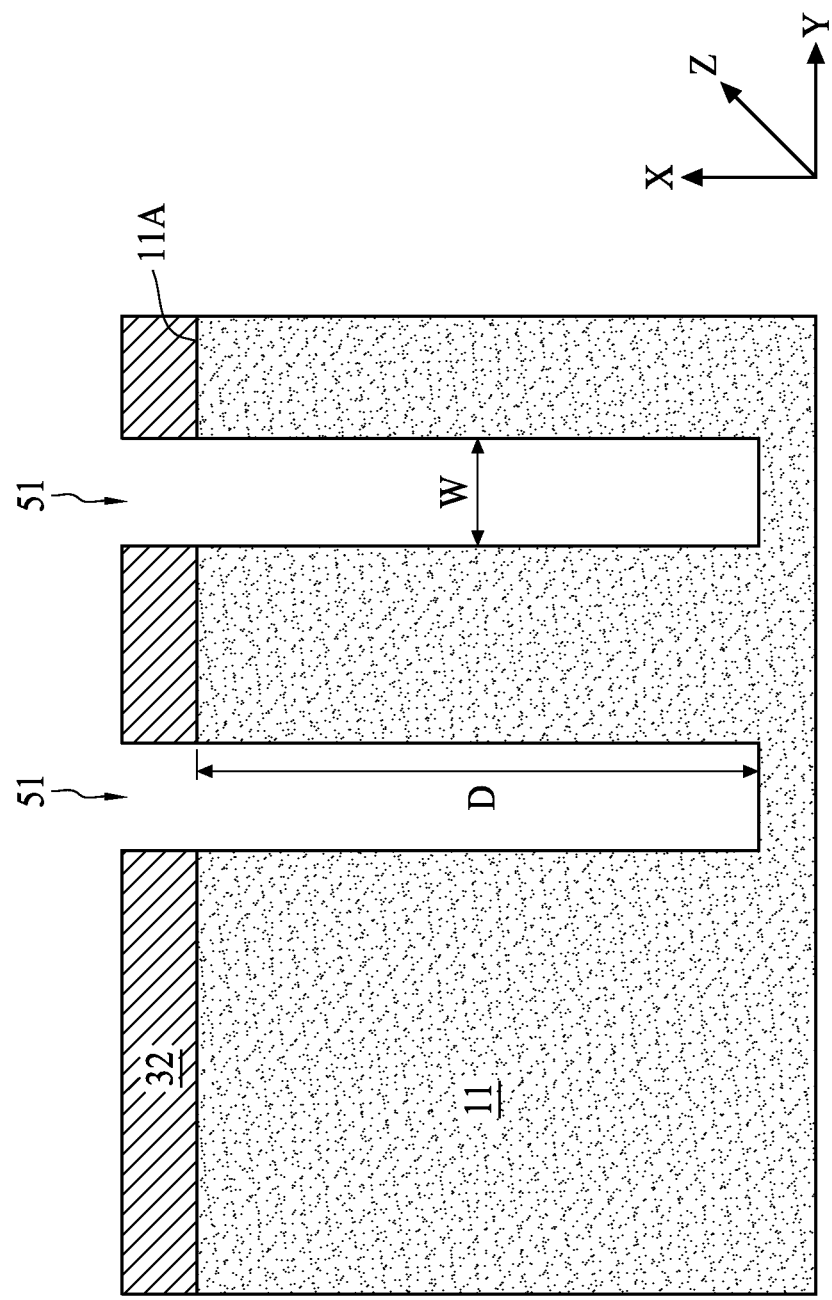

Referring back to FIG. 7 and operation 2010 in FIG. 20, the semiconductor substrate 11 with a first conductivity type such as an n-type conductivity is received. After the operations shown in FIGS. 8-10 are implemented, referring to FIG. 11 and operation 2020 in FIG. 20, the first doped region 521 and the second doped region 522 with a second conductivity type such as a p-type conductivity are formed. In certain embodiments, the p-type conductivity of the first doped region 521 and the second doped region 522 is formed through a mixture of hydrogen gas and dopant gas in a predetermined temperature range from about 600° C. to about 1200° C. so as to allow the impurity of dopant gas to insert into the first doped region 521 and the second doped region 522.

Figure 13:
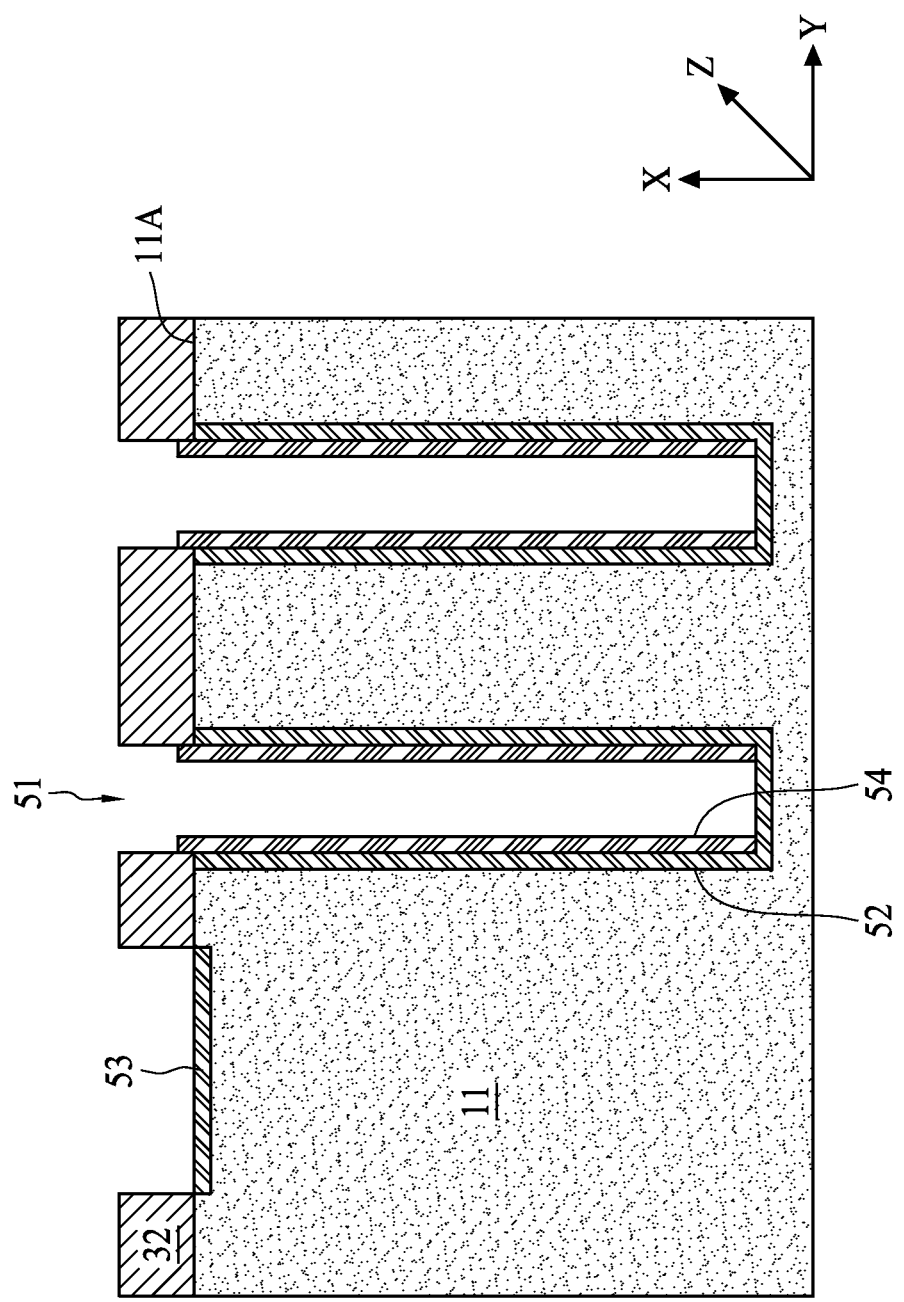

The method 2000 continues with various operations implemented in accordance with FIGS. 12-14. Referring to FIG. 16 and operation 2030 in FIG. 20, a dielectric 31 is formed in the semiconductor substrate 11 and between the first doped region 521 and the second doped region 522. In some embodiments, the depth of the first doped region 521 or the second doped region 522 is greater than about 15 μm.

In certain embodiments, the method 2000 further includes an operation in which a cover 41 is formed over the dielectric 31 as shown in FIG. 18. In addition, the method 2000 further includes an operation in which an interconnect 71 that is external to the semiconductor substrate 11 is formed so as to electrically connect the first doped region 521 and the second doped region 522 as shown in FIG. 2. In some embodiments, as in FIG. 2, the method 2000 further includes forming an epitaxial layer 81 under the first doped region 521 and the second doped region 522, and the epitaxial layer 81 is with a first conductivity type such as an n-type conductivity. In some other embodiments, as in FIG.

2, the method 2000 further includes an operation in which a conductive layer 82 is formed on a backside of the semiconductor substrate 11.

Figure 21:
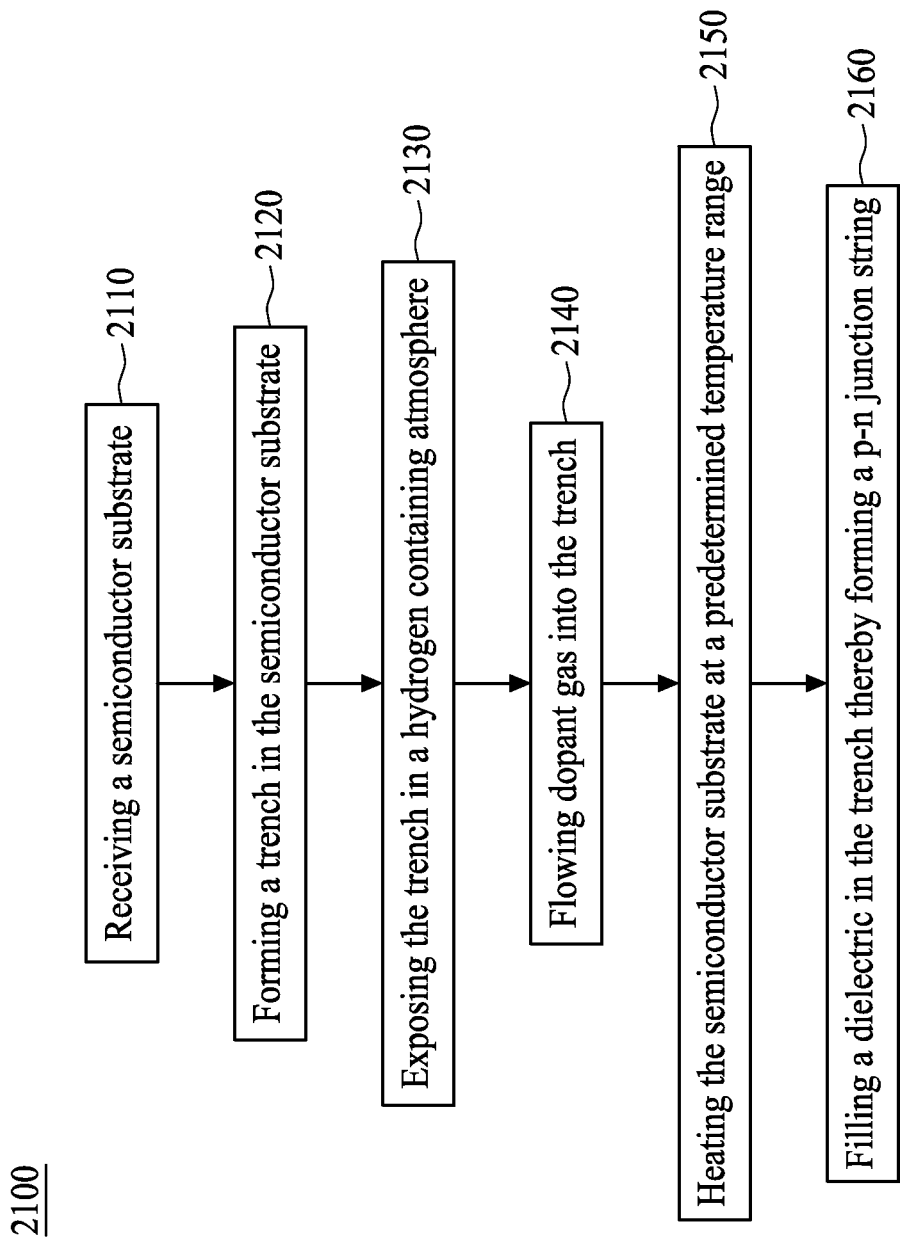
FIG. 21 is a flowchart of a method in manufacturing a semiconductor structure according to other embodiments of the present disclosure.

FIG. 21 is a diagram of a method 2100 for manufacturing a semiconductor structure in accordance with some embodiments of the present disclosure. The method 2100 includes several operations. At operation 2110, a semiconductor substrate is received. At operation 2120, a trench is formed in the semiconductor substrate. At operation 2130, the trench is exposed in a hydrogen containing atmosphere. At operation 2140, dopant gas is flowed into the trench. At operation 2150, the semiconductor substrate is heated at a predetermined temperature range, thereby inserting impurities provided from the dopant gas into the semiconductor substrate through exposed surfaces of the trench. At operation 2160, a dielectric is filled in the trench, thereby forming a p-n junction string electrically coupled to a transistor at one end, wherein each junction of the p-n junction string includes a doped strip with an aspect ratio extending along a depth in a semiconductor substrate. In addition, the dopant concentration uniformity along the depth is within 0.2% and the aspect ratio is greater than about 10.

Referring back to FIG. 7 and operation 2110, the semiconductor substrate 11 is received. After various operations are implemented as shown in FIGS. 8-9, referring to FIG. 10 and operation 2120 in FIG. 21, the trenches 51 are formed in the semiconductor substrate 11. In certain embodiments, the trenches 51 are exposed in a hydrogen containing atmosphere so as to complete the operation 2130 in FIG. 21. After dopant gas flows into the trenches 51 as illustrated in the operation 2140 in FIG. 21, the semiconductor substrate 11 is heated at a predetermined temperature range from about 600° C. to about 1200° C. in accordance with the operation 2150 in FIG. 21. The high temperature condition allows the impurities compound to be separated from the dopant gas. Thus, such impurities separated from the dopant gas are inserted into the semiconductor substrate 11 through an exposed surface 511 of the trenches 51 as shown in FIG. 11.

Referring to FIG. 15 and the operation 2160 in FIG. 21, a dielectric 31 is filled in the trenches 51. In some embodiments, as in FIG. 15, the impurities in the semiconductor substrate 11 are driven into a distance so as to form a p-n junction string 22 shown in FIG. 17. After removing the mask layer 32 and forming the cover 41 on the top surface 11A, a structure is completed as shown in FIG. 19.

In some embodiments, the method 2100 further includes an operation in which a gap G between adjacent p-n junctions of the p-n junction string 22 is defined as shown in FIG. 3. The gap G is between about 2 µm an and about 20 µm. In certain embodiments, the method 2100 further includes forming a pad 43 electrically coupled to the p-n junction string 22, wherein the pad 43 is configured to receive a voltage greater than about 100V. In other embodiments, the method 2100 continues with an operation in which a conductive line 44 connecting adjacent p-n junctions of the p-n junction string 22 is formed. In some other embodiments, the method 2100 further includes an operation in which an interconnect 71 external to the semiconductor substrate 11 is formed so as to electrically connect adjacent p-n junctions of the p-n junction string 22 as shown in FIG. 3. In addition, referring to FIG. 3, the p-n junction string 22 is electrically coupled to a transistor 62 at one end. Each junction of the p-n junction string 22 includes a doped strip 211C with an aspect ratio extending along a depth D3 in a semiconductor substrate 11. The dopant concentration uniformity along the depth D3 is within 0.2% and the aspect ratio is greater than about 10.

In some embodiments, a method for fabricating a semiconductor structure includes receiving a semiconductor substrate. The method also includes forming a trench along a depth in the semiconductor substrate, wherein the trench has an aspect ratio greater than about 10 and the depth is greater than about 15 µm. The method also includes exposing the semiconductor substrate in a hydrogen containing atmosphere. The method also includes inserting dopants into a portion of the semiconductor substrate. The portion of the semiconductor substrate surrounds the trench. The method also includes filling a dielectric in the trench. The method also includes driving the dopants into a predetermined distance in the semiconductor substrate.

In some embodiments, a method for fabricating a semiconductor structure includes receiving a semiconductor substrate with a first conductivity type. The method also includes forming a first doped region with a second conductivity type and a second doped region with the second conductivity type in the semiconductor substrate through a mixture of hydrogen gas and dopant gas in a predetermined temperature range. The method also includes forming a dielectric in the semiconductor substrate and between the first doped region and the second doped region. The first doped region and the second doped region are symmetrical with reference to the dielectric and respectively have an aspect ratio and a dopant concentration uniformity along a depth in the semiconductor substrate. The aspect ratio of the semiconductor substrate is greater than about 10.

In some embodiments, a method for fabricating a semiconductor structure includes receiving a semiconductor substrate. The method also includes forming a trench in the semiconductor substrate. The method also includes exposing the trench in a hydrogen containing atmosphere. The method also includes flowing dopant gas into the trench. The method also includes heating the semiconductor substrate at a predetermined temperature range, thereby inserting impurities provided from the dopant gas into the semiconductor substrate through an exposed surface of the trench. The method also includes filling a dielectric in the trench, thereby forming a p-n junction string electrically coupled to a transistor at one end. Each junction of the p-n junction string includes a doped strip with an aspect ratio extending along a depth in a semiconductor substrate. The dopant concentration uniformity along the depth is within 0.2% and the aspect ratio is greater than about 10.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, or is intended to mean an inclusive or rather than an exclusive "or". In addition, "a" and an as used in this application are generally to be construed to mean one or more unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising".

What is claimed is:

1. A method for manufacturing a semiconductor structure, comprising:
   fabricating a semiconductor substrate;
   etching a first trench along a depth in the semiconductor substrate, wherein the first trench has an aspect ratio greater than about 10 and the depth is greater than about 15 pm;
   exposing the semiconductor substrate in a hydrogen containing atmosphere;
   inserting dopants into a portion of the semiconductor substrate to form a doped region that surrounds the first trench;
   depositing or epitaxially growing a dielectric in the first trench; and
   driving the dopants from the doped region by diffusing along the first trench perpendicular to the depth of the semiconductor substrate into a predetermined distance in the semiconductor substrate to enlarge the doped region.

2. The method of claim 1, further comprising depositing a liner on the portion of the semiconductor substrate.

3. The method of claim 2, further comprising removing a portion of the liner, wherein the portion of the liner is on a bottom of the first trench.

4. The method of claim 3, further comprising removing an amount of the semiconductor substrate exposed from the remaining portion of the liner on the bottom of the first trench through the first trench, wherein the amount of the semiconductor substrate is doped.

5. The method of claim 1, further comprising grinding a backside of the semiconductor substrate.

6. The method of claim 1, wherein the dopant concentration uniformity along the depth is within about 0.2%.

7. The method of claim 1, wherein the predetermined percentage of hydrogen gas is from about 10% to about 50%.

8. The method of claim 1, further comprising forming a cover over the dielectric.

9. The method of claim 1, wherein the doped region comprises a first doped region and a second doped region, wherein the substrate is with a first conductivity type and the first doped region and the second doped region are with a second conductivity type.

10. The method of claim 9, further comprising forming an interconnect external to the semiconductor substrate to electrically connect the first doped region and the second doped region.

11. The method of claim 9, further comprising forming an epitaxial layer under the first doped region and the second doped region, wherein the epitaxial layer is with the first conductivity type.

12. The method of claim 1, further comprising forming a conductive layer on a backside of the semiconductor substrate.

13. The method of claim 1, wherein exposing the semiconductor substrate in the hydrogen containing atmosphere further comprising exposing the semiconductor substrate in the hydrogen containing atmosphere in a predetermined temperature range from about 600° C. to about 1200° C.

14. The method of claim 1, further comprising etching a second trench, separated from the first trench with a gap, along the depth in the semiconductor substrate.

15. The method of claim 14, wherein the gap is between about 2 μm and about 20 μm.

* * * * *